(12) United States Patent
Fenney

(10) Patent No.: US 12,548,200 B2
(45) Date of Patent: Feb. 10, 2026

(54) COMPRESSION AND DECOMPRESSION OF SUB-PRIMITIVE PRESENCE INDICATIONS FOR USE IN A RENDERING SYSTEM

(71) Applicant: Imagination Technologies Limited, Kings Langley (GB)

(72) Inventor: Simon Fenney, St. Albans (GB)

(73) Assignee: Imagination Technologies Limited, Kings Langley (GB)

( * ) Notice: Subject to any disclaimer, the term of this patent is extended or adjusted under 35 U.S.C. 154(b) by 301 days.

(21) Appl. No.: 18/202,979

(22) Filed: May 29, 2023

(65) Prior Publication Data

US 2024/0029314 A1    Jan. 25, 2024

(30) Foreign Application Priority Data

May 30, 2022   (GB) ........................................ 2207938
May 30, 2022   (GB) ........................................ 2207941

(51) Int. Cl.
    *G06T 9/00*       (2006.01)
    *G06T 15/06*      (2011.01)

(52) U.S. Cl.
    CPC .............. *G06T 9/001* (2013.01); *G06T 15/06* (2013.01)

(58) Field of Classification Search
    None
    See application file for complete search history.

(56) References Cited

U.S. PATENT DOCUMENTS

| | | | |
|---|---|---|---|
| 6,489,955 B1* | 12/2002 | Newhall, Jr. | G06T 15/40 345/419 |
| 10,991,127 B2* | 4/2021 | Nevraev | G06T 15/80 |
| 11,995,767 B2* | 5/2024 | Doyle | G06T 3/4007 |
| 2016/0247249 A1 | 8/2016 | Harris et al. | |
| 2019/0019326 A1* | 1/2019 | Clark | G06T 17/005 |
| 2020/0051316 A1 | 2/2020 | Laine et al. | |
| 2021/0201559 A1 | 7/2021 | Gruen | |
| 2024/0029314 A1 | 1/2024 | Fenney | |
| 2024/0029315 A1* | 1/2024 | Fenney | G06T 9/001 |
| 2024/0119634 A1 | 4/2024 | Fenney et al. | |
| 2024/0119635 A1* | 4/2024 | Fenney | G06T 15/06 |
| 2024/0127485 A1* | 4/2024 | Ozkan | G06T 15/005 |

OTHER PUBLICATIONS

Extended European search report and search opinion for EP appl. No. 23175299 dated Oct. 30, 2023 (Year: 2023).*
Gruen et al., "Sub-triangle opacity masks for faster ray tracing of transparent objects"; Proc.ACM Comput. Graph. Interact. Tech; vol. 3; No. 2; Aug. 26, 2020; pp. 1-12.

* cited by examiner

*Primary Examiner* — Scott A Rogers
(74) *Attorney, Agent, or Firm* — Potomac Law Group, PLLC; Vincent M DeLuca

(57) ABSTRACT

A method and a compression unit are provided for compressing, into a block of compressed data, a block of sub-primitive presence indications for use in a rendering system. The block of sub-primitive presence indications comprises a plurality of sub-blocks of sub-primitive presence indications. A plurality of candidates for combinations of presence indications are identified. For each of the sub-blocks in the block of sub-primitive presence indications: one of the candidates to be used to represent the sub-block is selected, and an index to indicate the selected candidate is stored in the block of compressed data.

20 Claims, 15 Drawing Sheets

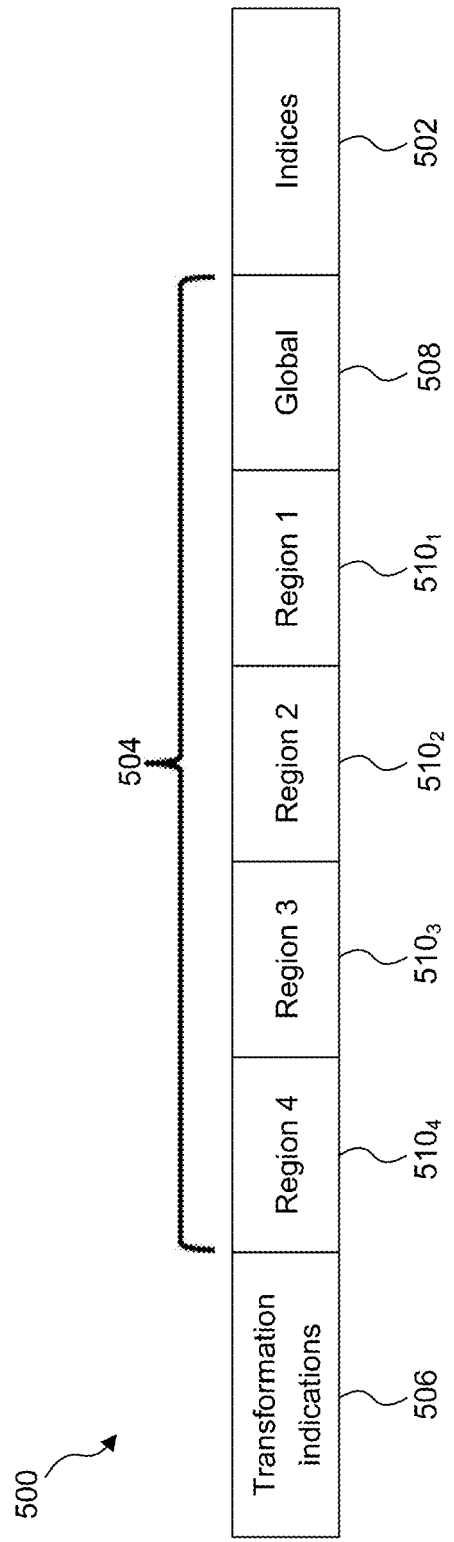

COMPRESSION AND DECOMPRESSION OF SUB-PRIMITIVE PRESENCE INDICATIONS FOR USE IN A RENDERING SYSTEM

CROSS-REFERENCE TO RELATED APPLICATIONS AND CLAIM OF PRIORITY

This application claims foreign priority under 35 U.S.C. 119 from United Kingdom patent application Nos. GB2207941.2 filed on 30 May 2022 and GB2207938.8 filed on 30 May 2022, which are incorporated herein by reference in their entirety.

FIELD

The present disclosure is directed to techniques of compressing and/or decompressing sub-primitive presence indications for use in a rendering system.

BACKGROUND

Rendering systems can be used to generate an image of a scene. Two common rendering techniques are ray tracing and rasterization. In particular, ray tracing is a computational rendering technique for generating an image of a scene (e.g. a 3D scene) by tracing paths of light ('rays') usually from the viewpoint of a camera through the scene. Each ray is modelled as originating from the camera and passing through a pixel into the scene. As a ray traverses the scene it may intersect objects within the scene. The interaction between a ray and an object it intersects can be modelled to create realistic visual effects. For example, in response to determining an intersection of a ray with an object, a shader program (i.e. a portion of computer code) may be executed in respect of the intersection. A programmer can write the shader program to define how the system reacts to the intersection which may, for example cause one or more secondary rays to be emitted into the scene, e.g. to represent a reflection of the ray off the intersected object or a refraction of the ray through the object (e.g. if the object is transparent or translucent). As another example, the shader program could cause one or more rays to be emitted into the scene for the purposes of determining whether the object is in shadow at the intersection point. The result of executing the shader program (and processing the relevant secondary rays) can be the calculation of a colour value for the pixel the ray passed through.

Rendering an image of a scene using ray tracing may involve performing many intersection tests, e.g. billions of intersection tests for rendering an image of a scene. In order to reduce the number of intersection tests that need to be performed, ray tracing systems can generate acceleration structures, wherein each node of an acceleration structure represents a region within the scene. Acceleration structures are often hierarchical (e.g. having a tree structure) such that they include multiple levels of nodes, wherein nodes near the top of the acceleration structure represent relatively large regions in the scene (e.g. the root node may represent the whole scene), and nodes near the bottom of the acceleration structure represent relatively small regions in the scene. Leaf nodes of the acceleration structure represent regions bounding at least one primitive, or part of a primitive, in the scene, and have pointers to the bounded primitives.

Intersection testing can be performed for a ray (e.g. in a recursive manner) using the acceleration structure by first testing the ray for intersection with the root node of the acceleration structure. If the ray is found to intersect a parent node (e.g. the root node), testing can then proceed to the child nodes of that parent. In contrast, if the ray is found not to intersect a parent node, intersection testing of the child nodes of that parent node can be avoided, saving computational effort. If a ray is found to intersect a leaf node then it can be tested against the objects within the region represented by the leaf node to thereby determine which object(s) the ray intersects with. The objects may be represented using "primitives". A primitive denotes a unit of geometry in the system, and may for example be a convex polygon. Often the primitives are triangles, but they may be other shapes, e.g. rectangles (the term "rectangle" is used herein to include "square"), pentagons, hexagons, or non-planar shapes such as spheres or bicubic surface patches, or with curved edges, etc.

Primitives are usually simple geometric shapes to facilitate intersection testing to determine whether a ray intersects a primitive. However, primitives can be used to represent more complex shapes. For example, a texture, e.g. a 2D image or a 3D volume, can be applied to a primitive, wherein the texture may have an alpha value which determines the opacity at different positions on the primitive, e.g. a maximum sampled alpha value (e.g. a value of 255 for 8-bit alpha values) means that the primitive is fully opaque at a sample position and a minimum sampled alpha value (e.g. a value of 0) means that the primitive is fully transparent at the sample position. Values in between the minimum and maximum alpha values can represent partial opacity. For the purposes of intersection testing in a ray tracing system, if a ray intersects a primitive at a position where the primitive is fully transparent (i.e. at a position where the alpha value is zero) then the intersection is not accepted, i.e. the ray passes straight through the primitive. In this way, setting the alpha value to zero can be used to represent holes in the primitive, i.e. positions on the primitive that are 'absent' so far as the intersection testing process is concerned. For intermediate alpha values, the system may opt to perform a weighted sum of the objects behind the primitive and of the shaded surface itself or, perhaps, to use a threshold value, often referred to in the art as an alpha test. Textures which include absent regions may be referred to as "punch through textures", "alpha tested textures" or "masked textures", and primitives to which these textures are applied may be referred to as "punch through primitives", "alpha tested transparent primitives" or "masked primitives". Punch through primitives are useful for representing geometry which has a complicated perimeter or lots of holes in it, such as foliage and chain link fences, with a small number of primitives.

Note that a 'texture' may not necessarily be an actual image—it may be computed 'on the fly'. Such computation may be done by executing a 'shader' program. 'Checking a texture' may thus also be understood to include these computational approaches.

FIG. 1 shows an example of two triangular primitives 1021 and 1022 which share an edge to form a quad. A texture representing a leaf is applied to the two primitives. The texture has some regions (e.g. 104) which are fully transparent, such that they are absent for the purposes of intersection testing. The texture also has some regions (e.g. 106) which are not transparent (e.g. they are opaque), such that they are present for the purposes of intersection testing. Finally, there may be a small number of regions (e.g. along the boundary between regions 104 and 106) which are partially transparent which may be handled with, for example, the two approaches mentioned previously for 'intermediate alpha' values. Different ray tracing systems may react differently to finding an intersection of a ray with a partially transparent region, e.g. the intersection may be treated as a hit, a miss or as a partial hit. One or more additional rays may be spawned as a result of a partial hit.

When an intersection testing process finds that a ray intersects a punch through primitive then the intersection testing process for the ray may be stalled while a shader program is executed on a programmable execution unit to determine whether the primitive is present at the intersection point where the ray intersects the primitive. The presence of the primitive at the intersection point is often determined by the alpha channel of a texture that is mapped onto the primitive. Passing between the intersection testing process (which may be implemented in fixed function hardware) and a shader program (which is executed on a programmable execution unit) introduces latency into the ray tracing system. For example, fixed function hardware implementing the intersection testing process may stall for thousands of clock cycles while the shader program is executed on a programmable execution unit to determine the presence of the primitive at an intersection point. So reducing the number of times that a shader program needs to be executed to determine the presence of a punch through primitive at an intersection point would significantly improve the performance of the ray tracing system. It would be particularly beneficial to reduce the number of times that a shader program needs to be executed to determine the presence of a punch through primitive at an intersection point without increasing the number of primitives used to represent the geometry because increasing the number of primitives would increase the processing costs in the ray tracing system, e.g. the processing costs of rendering, simulation and updates to the acceleration structure.

A paper called "Sub-triangle opacity masks for faster ray tracing of transparent objects" by Holger Gruen, Carsten Benthin and Sven Woop (Proceedings of the ACM on Computer Graphics and Interactive Techniques, Volume 3, Issue 2, Article No.: 18) proposes using sub-triangle opacity masks for ray tracing of alpha tested transparent primitives. Each triangular primitive is subdivided into a set of uniformly sized sub-primitives. For example, FIG. 2 shows a triangular primitive 202 that is subdivided into 64 uniformly sized sub-primitives, labelled 0 to 63. Barycentric coordinates are labelled for the three vertices of the triangular primitive 202 as b=0,0,1, b=0,1,0 and b=1,0,0. Any position within the triangular primitive 202 can be uniquely identified with barycentric coordinates, to thereby indicate which of the sub-primitives (0 to 63) the position is within. For each sub-primitive (0 to 63) an evaluation is made in a pre-processing step to determine sub-primitive presence indications which indicate whether each of the sub-primitives is: (i) fully present, (ii) fully absent, or (iii) partially present. If a sub-primitive is partially present then the texture would need to be checked, e.g. by executing a shader program, to determine whether a particular point within the sub-primitive is present or absent. This pre-processing step may be performed by an Application Programming Interface (API) or as part of the process of creating the primitives and textures, e.g. by a user. Each of the sub-primitive presence indications is represented with 2 bits to indicate one of the three presence states: (i) fully present, (ii) fully absent, or (iii) partially present. A "partially present" state may be referred to as a "check texture" state because the presence at a position within a sub-primitive which is partially present is determined by checking the texture, i.e. by executing a shader program.

When an intersection is found between a ray and a primitive, the presence indications can be queried in order to determine whether to accept the intersection. The position of an intersection within a primitive, e.g. as indicated with barycentric coordinates, is used to identify the sub-primitive that the intersection point is within. If the presence indication for the identified sub-primitive indicates that the sub-primitive is fully present or fully absent then the intersection testing process can continue with the intersection testing without needing to execute a shader program to determine the presence of the primitive at the intersection point. However, if the presence indication for the identified sub-primitive indicates that the sub-primitive is partially present then the texture is checked, by executing a shader program, to determine the presence of the primitive at the intersection point.

The use of the presence indications reduces the number of times that a shader program needs to be executed to check a texture to determine the presence of a primitive at an intersection point to determine whether to accept an intersection. In other words, the presence indications are used to determine fully absent and fully present regions of primitives thereby reducing the number of times that alpha testing needs to be performed, thereby skipping the more expensive alpha-test operation where possible. Alpha testing (i.e. running a shader program to check the alpha value of the texture at the intersection point) is an expensive operation in terms of latency and power consumption.

If a primitive is sub-divided into K sub-primitives, 2K bits are used for the presence indications for the primitive, and these bits would be included with the rest of the primitive data for the primitive in the intersection testing process. In the example shown in FIG. 2, K is 64, such that 128 bits are used for the presence indications for the primitive 202. This is a significant increase in the amount of primitive data used to describe a primitive.

Furthermore, UK patents GB2538856B and GB2522868B describe a rasterization rendering technique in which an opacity state map is used to indicate whether blocks of texels of a texture are fully opaque, fully transparent, partially transparent or a mixture of these states. The indications in the opacity state map can be used to accelerate the processing of punch through primitives in a rasterization system. Similar to the presence indications described above with reference to a ray tracing system, each of the opacity states in the rasterization system of GB2538856B and GB2522868B is represented with two bits.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

There is provided a method of compressing, into a block of compressed data, a block of sub-primitive presence indications for use in a rendering system (e.g. for use in intersection testing in the rendering system), wherein the block of sub-primitive presence indications comprises a plurality of sub-blocks of sub-primitive presence indications, the method comprising:

identifying a plurality of candidates for combinations of presence indications; and for each of the sub-blocks in the block of sub-primitive presence indications:

selecting one of the candidates to be used to represent the sub-block; and storing, in the block of compressed data, an index to indicate the selected candidate.

The method may further comprise storing, in the block of compressed data, candidate data representing one or more of the plurality of candidates.

The candidate data representing one or more of the plurality of candidates may be stored in a respective one or more entries in a codebook in the block of compressed data.

Each of the sub-blocks may have four presence indications in a 2×2 arrangement, and each of the one or more of the plurality of candidates which is represented by candidate data in the block of compressed data may be represented with five bits of candidate data comprising:

one bit to indicate one of: (i) a first palette of fully present and partially present, and (ii) a second palette of fully absent and partially present; and one bit for each of the four presence indications of the candidate to indicate either partially present or the other state of the indicated palette.

The block of sub-primitive presence indications may comprise 64 sub-blocks each of which may comprise four sub-primitive presence indications, such that the block of sub-primitive presence indications may have 256 presence indications.

Each of the sub-blocks may have sixteen presence indications comprising four 2×2 groups of presence indications, and each of the one or more of the plurality of candidates which is represented by candidate data in the block of compressed data may be represented with, for each of four 2×2 groups of presence indications for a sub-block, five bits of candidate data comprising:

one bit to indicate one of: (i) a first palette of fully present and partially present, and (ii) a second palette of fully absent and partially present; and one bit for each of the four presence indications of the 2×2 group to indicate either partially present or the other state of the indicated palette.

Each of the sub-blocks may have sixteen presence indications comprising four 2×2 groups of presence indications, and wherein each of the one or more of the plurality of candidates which is represented by candidate data in the block of compressed data may be represented with:

for each of four 2×2 groups of presence indications for a sub-block, a sub-index to indicate an entry in a sub-codebook; and the sub-codebook comprising a plurality of entries for 2×2 groups of presence indications, wherein each entry in the sub-codebook may comprise five bits of candidate data comprising:

one bit to indicate one of: (i) a first palette of fully present and partially present, and (ii) a second palette of fully absent and partially present; and one bit for each of the four presence indications of the 2×2 group to indicate either partially present or the other state of the indicated palette.

The block of sub-primitive presence indications may comprise 256 sub-blocks each of which may comprise sixteen sub-primitive presence indications, such that the block of sub-primitive presence indications may have 4096 presence indications.

The block of sub-primitive presence indications may comprise 576 sub-blocks each of which may comprise sixteen sub-primitive presence indications, such that the block of sub-primitive presence indications may have 9216 presence indications.

At least one of the plurality of candidates might not be represented by candidate data stored in the block of compressed data.

Each of said at least one of the plurality of candidates that is not represented by candidate data stored in the block of compressed data may represent a sub-block whose sub-primitive presence indications are all the same.

The sub-primitive presence indications may indicate a presence state for their respective sub-primitives as one of: (i) fully present, (ii) fully absent, or (iii) partially present.

The index for a sub-block may be a T-bit index, wherein T may be less than the number of sub-primitive presence indications in one of the sub-blocks. For example, each of the sub-blocks may comprise four sub-primitive presence indications and T=3. As another example, each of the sub-blocks may comprise sixteen sub-primitive presence indications and T=5.

The block of sub-primitive presence indications may have a plurality of regions, each of the regions comprising a plurality of the sub-blocks, wherein one or more of the identified candidates may be region-specific candidates such that they are candidates for sub-blocks within only one of the regions of the block.

One or more of the identified candidates may be global candidates such that they are candidates for sub-blocks within all of the regions of the block.

Candidate data stored in the block of compressed data may have: (i) candidate data representing three global candidates, and (ii) candidate data representing two region-specific candidates for each of the regions.

Candidate data stored in the block of compressed data may have candidate data representing 29 global candidates.

The regions of the block may be quadrants of the block.

The method may further comprise storing, in the block of compressed data, for each of one or more of the regions, an indication of a transformation to be applied to candidate data representing candidates for sub-blocks within that region.

The transformation may comprise one or both of a rotation and a reflection.

Each of the indications of a transformation may comprise three 1-bit flags: (i) a 90 degree rotation flag, (ii) a vertical reflection flag, and (iii) a horizontal reflection flag.

Said selecting one of the candidates to be used to represent the sub-block may comprise selecting a candidate which is compatible with the presence indications in the sub-block.

The sub-primitives may be rectangular or triangular.

The method may further comprise storing the block of compressed data.

The rendering system may be a ray tracing system or a rasterization system.

There is provided a compression unit configured to compress, into a block of compressed data, a block of sub-primitive presence indications for use in a rendering system (e.g. for use in intersection testing in the rendering system), wherein the block of sub-primitive presence indications comprises a plurality of sub-blocks of sub-primitive presence indications, the compression unit being configured to:

identify a plurality of candidates for combinations of presence indications; and for each of the sub-blocks in the block of sub-primitive presence indications:

select one of the candidates to be used to represent the sub-block; and store, in the block of compressed data, an index to indicate the selected candidate.

There may be provided a compression unit configured to perform any of the compression methods described herein.

There may be provided a method of decompressing compressed data to determine one or more sub-primitive presence indications for use in a rendering system (e.g. for use in intersection testing in the rendering system), the method comprising:
  receiving a block of compressed data for a block of sub-primitive presence indications, wherein the block of sub-primitive presence indications comprises a plurality of sub-blocks of sub-primitive presence indications, and wherein the block of compressed data comprises, for each of the sub-blocks in the block of sub-primitive presence indications, an index to indicate one of a plurality of candidates for combinations of presence indications;
  reading an index from the block of compressed data for one of the sub-blocks in the block of sub-primitive presence indications;
  obtaining candidate data representing at least a portion of the candidate indicated by the read index; and
  using the obtained candidate data to determine one or more of the presence indications in the sub-block.

There may be provided a decompression unit configured to decompress compressed data to determine one or more sub-primitive presence indications for use in a rendering system (e.g. for use in intersection testing in the rendering system), the decompression unit being configured to:
  receive a block of compressed data for a block of sub-primitive presence indications, wherein the block of sub-primitive presence indications comprises a plurality of sub-blocks of sub-primitive presence indications, and wherein the block of compressed data comprises, for each of the sub-blocks in the block of sub-primitive presence indications, an index to indicate one of a plurality of candidates for combinations of presence indications;
  read an index from the block of compressed data for one of the sub-blocks in the block of sub-primitive presence indications;
  obtain candidate data representing at least a portion of the candidate indicated by the read index; and
  use the obtained candidate data to determine one or more of the presence indications in the sub-block.

The compression unit or decompression unit may be embodied in hardware on an integrated circuit. There may be provided a method of manufacturing, at an integrated circuit manufacturing system, a compression unit or a decompression unit. There may be provided an integrated circuit definition dataset that, when processed in an integrated circuit manufacturing system, configures the system to manufacture a compression unit or a decompression unit. There may be provided a non-transitory computer readable storage medium having stored thereon a computer readable description of a compression unit or a decompression unit that, when processed in an integrated circuit manufacturing system, causes the integrated circuit manufacturing system to manufacture an integrated circuit embodying a compression unit or a decompression unit.

There may be provided an integrated circuit manufacturing system comprising: a non-transitory computer readable storage medium having stored thereon a computer readable description of the compression unit or decompression unit; a layout processing system configured to process the computer readable description so as to generate a circuit layout description of an integrated circuit embodying the compression unit or decompression unit; and an integrated circuit generation system configured to manufacture the compression unit or decompression unit according to the circuit layout description.

There may be provided computer program code for performing any of the methods described herein. There may be provided non-transitory computer readable storage medium having stored thereon computer readable instructions that, when executed at a computer system, cause the computer system to perform any of the methods described herein.

The above features may be combined as appropriate, as would be apparent to a skilled person, and may be combined with any of the aspects of the examples described herein.

BRIEF DESCRIPTION OF THE DRAWINGS

Examples will now be described in detail with reference to the accompanying drawings in which:

FIG. 5 illustrates an example of a block of compressed data;

Figure 1:
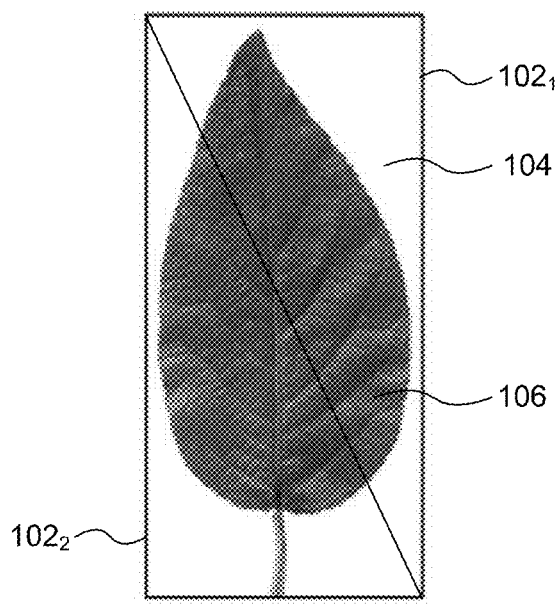
FIG. 1 shows a punch through texture applied to two primitives which form a quad.
Figure 2:
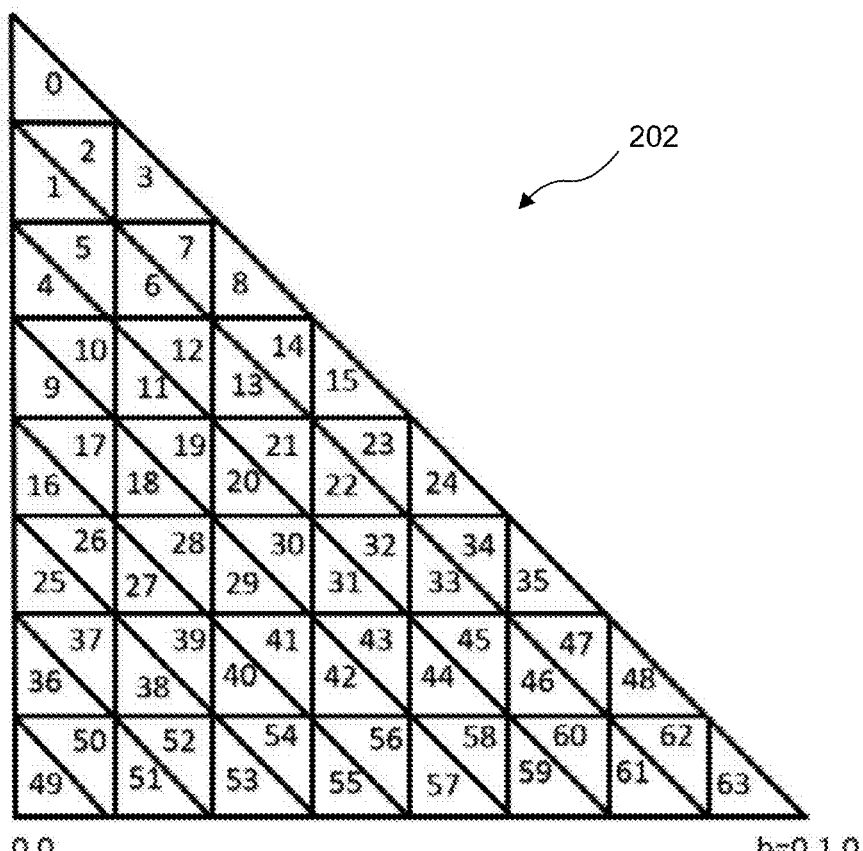
FIG. 2 shows a triangular primitive which is sub-divided into 64 sub-primitives.

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures, where appropriate, to indicate similar features.

DETAILED DESCRIPTION

The following description is presented by way of example to enable a person skilled in the art to make and use the invention. The present invention is not limited to the embodiments described herein and various modifications to the disclosed embodiments will be apparent to those skilled in the art.

Embodiments will now be described by way of example only. In the present disclosure, a sub-primitive presence indication is representative of a presence state of a corresponding sub-primitive.

In the ray tracing system described in the background section above, each of the presence indications is stored with 2 bits, such that if a primitive is sub-divided into K sub-primitives, 2K bits are used for the presence indications for the primitive. Reducing the amount of data used to represent the presence indications would be beneficial in terms of reducing the amount of memory needed to store the presence indications and reducing the amount of data transferred between different components in the ray tracing system. Therefore, the reduction in the amount of data used to represent the presence indications may reduce the latency, power consumption and silicon area of the ray tracing system.

As a simple example of how to compress the presence indications, it is noted that two bits are used for each presence indication to indicate one of three presence states (fully present, fully absent or partially present), so if we combine the presence information for multiple sub-primitives then the presence indications for a group of sub-primitives may be able to be represented with fewer than an average of 2 bits per sub-primitive. As an example, the presence indications for a group of 5 sub-primitives (i.e. $3^5=243$ possible combinations of presence states) could be stored in 8 bits (i.e. $2^8=256$ possible encodings). In this simple example, if a primitive is sub-divided into K sub-primitives, approximately 1.6K bits are used for the presence indications for the primitive. The compression of 2K bits to 1.6K bits represents a compression ratio of 80%, where the compression ratio is defined as the size of the compressed data divided by the size of the uncompressed data. Compressing data to a greater extent results in a smaller compression ratio.

In the examples described below, compression and decompression techniques are described which can compress the presence indications to a greater extent (i.e. achieve lower compression ratios) than in the simple example described above.

Note that having three states, as opposed to a simpler scheme with only "fully present" and "fully absent" states, is attractive from a quality point of view as a two state system is likely to lead to aliasing (i.e. jagged edges) unless, perhaps, an extremely high resolution, and thus memory intensive, mask is used. Further, though a two-state scheme may benefit from never having to run a shader to "check texture", it also means that some use cases which do need partial transparency, e.g. modelling a stained-glass window, would be suboptimal. Having said this, the examples described below in which a vector quantisation approach is used can be adapted by one skilled in the art, to a system with just two states.

Figure 3A:
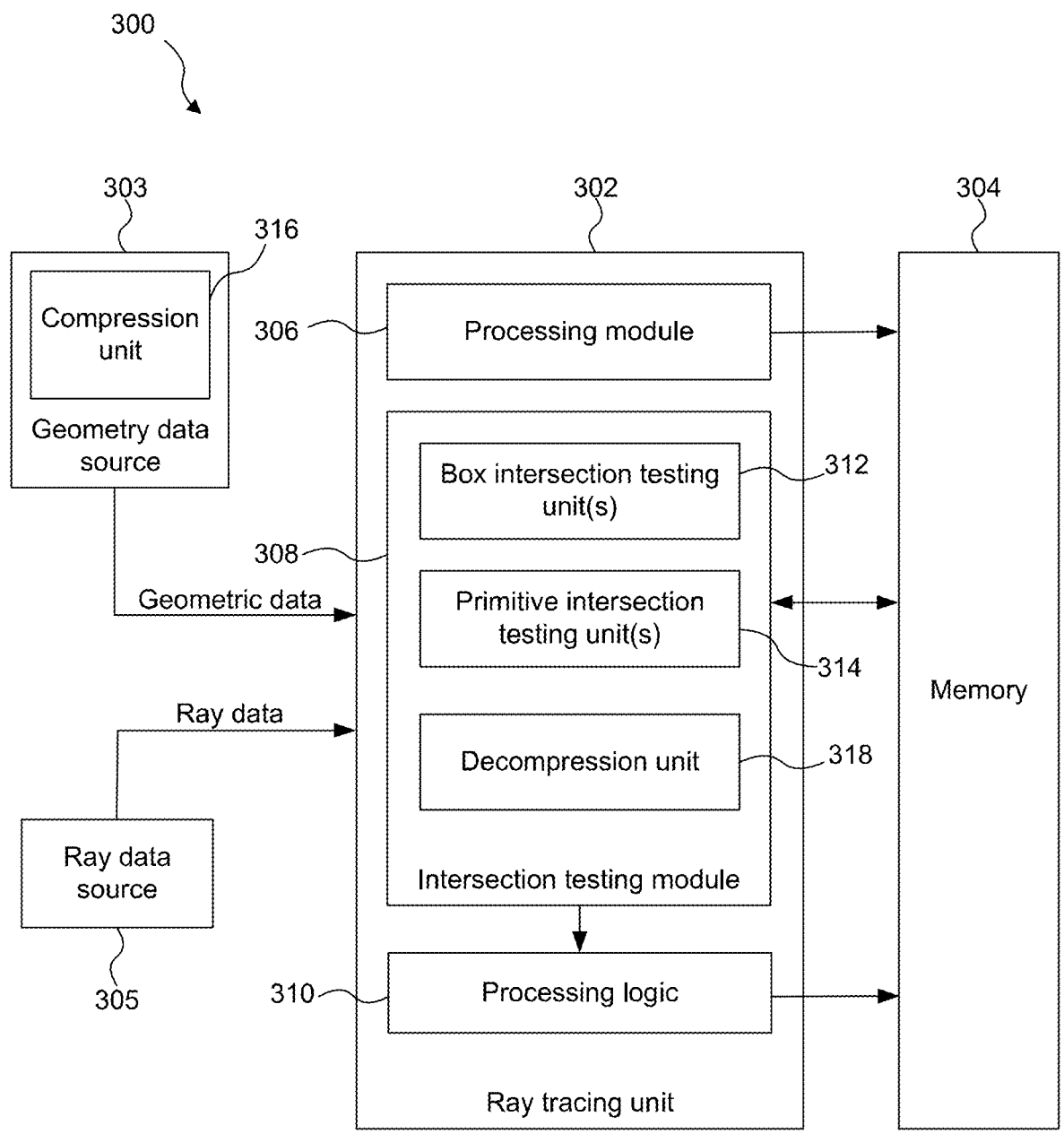
FIG. 3a shows a ray tracing system according to examples described herein.

FIG. 3a shows a ray tracing system 300 comprising a ray tracing unit 302 and a memory 304. The ray tracing system 300 also comprises a geometry data source 303 and a ray data source 305. The ray tracing unit 302 comprises a processing module 306, an intersection testing module 308 and processing logic 310. The intersection testing module 308 comprises one or more box intersection testing units 312, one or more primitive intersection testing units 314, and a decompression unit 318. The geometry data source comprises a compression unit 316. In operation the ray tracing unit 302 receives geometric data defining objects within the 3D scene from the geometry data source 303. The ray tracing unit 302 also receives ray data defining rays that are to be tested for intersection from the ray data source 305. The rays may be primary rays or secondary rays. The processing module 306 is configured to generate an acceleration structure based on the geometric data, and to send the acceleration structure to the memory 304 for storage therein. After the acceleration structure has been stored in the memory 304, the intersection testing module 308 can retrieve nodes (e.g. comprising data defining axis-aligned boxes corresponding to the nodes) of the acceleration structure from the memory 304 to perform intersection testing of rays against the retrieved nodes. The box intersection testing unit(s) 312 perform intersection tests to determine whether or not a ray intersects each of the bounding boxes corresponding to nodes of the acceleration structure (where a miss can cull vast swathes of the hierarchical acceleration structure). If it is determined that a leaf node is intersected then the primitive intersection testing unit(s) 314 perform one or more primitive intersection tests to determine which object(s) (if any) the ray intersects. In this example, the primitives are triangles, or pairs of triangles, although it is noted that in other examples, the primitives could be other shapes, e.g. other convex planar polygons, such as rectangles (which includes squares), pentagons, hexagons, etc. The results of the intersection tests indicate which primitive in the scene a ray intersects, and the results may also indicate other intersection data, such as a position on the object at which the ray intersects the object (e.g. defined in terms of barycentric coordinates), and may also indicate a distance, e.g., Euclidean or as a (signed) multiple of ray lengths, along the ray that the intersection occurs. In some instances, the intersection determination may be based on whether the distance along the ray that the intersection occurs is between minimal and maximal clipping distances for the ray (which may be referred to as $t_{min}$ and $t_{max}$). The results of the intersection testing are provided to the processing logic 310. The processing logic 310 is configured to process the results of the intersection testing to determine rendered values representing the image of the 3D scene. The rendered values determined by the processing logic 310 can be passed back to the memory 304 for storage therein to represent the image of the 3D scene.

In the examples described herein the ray tracing system uses an acceleration structure in order to reduce the number of intersection tests that need to be performed for a ray against primitives. However, it is noted that some other examples might not use an acceleration structure, and may simply test rays against the primitives without first attempting to reduce the number of intersection tests that need to be performed using an acceleration structure.

When the primitive intersection testing unit(s) 314 of the intersection testing module 308 determine that a ray intersects a primitive which has partial presence then typically the intersection testing module 308 would need to stall while a shader program was executed on the processing logic 310 to resolve the presence of the primitive at the intersection point. Some of these stalls can be avoided by the use of the sub-primitive presence indications as described herein.

Compression and decompression of the sub-primitive presence indications is performed, in examples described below, using a vector quantisation approach, which is a potentially lossy compression approach. In this approach, a block of sub-primitive presence indications is compressed into a block of compressed data for use in intersection testing in a ray tracing system. The inventors have realised that because the primitives represent physical structures, the distribution of presence indications is rarely random. Sub-primitives with a particular presence state are often next to sub-primitives with the same presence state. This order (i.e. non-randomness) to the distribution of presence states can be leveraged to achieve better compression of the block of presence indications.

It is noted that in the example shown in FIG. 3a the compression unit 316 is implemented in the geometry data source 303, but in other examples, the compression unit 316 could be implemented in a different component to the geometry data source 303, and in some examples may be implemented in the ray tracing unit 302, e.g. as part of the intersection testing module 308. Furthermore, in the example shown in FIG. 3a, the decompression unit 318 is implemented as part of the intersection testing module 308, but in other examples it could be implemented somewhere other than as part of the intersection testing module 308.

Figure 3B:
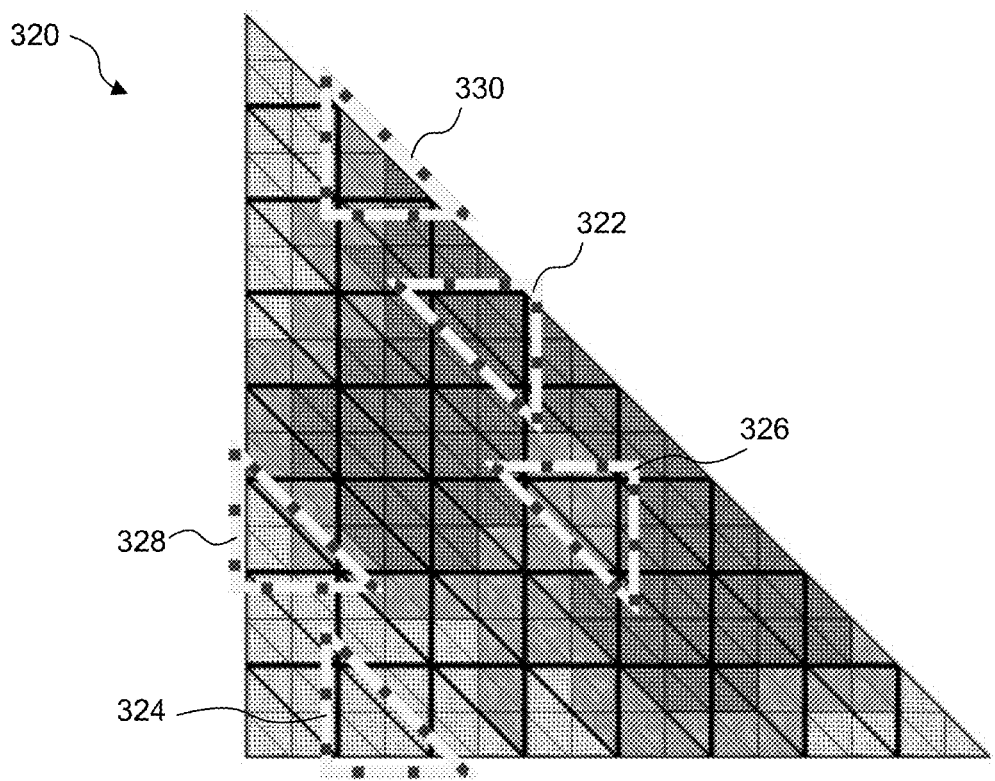
FIG. 3b shows presence indications of sub-triangles within a triangular primitive.

A method of compressing a set of sub-triangles in a triangle primitive is described with reference to FIG. 3b. The example triangle 320 has been subdivided into 256 sub-triangle regions and each of these has been shaded according to the corresponding presence indication, with light grey corresponding to 'fully absent', dark grey corresponding to 'fully present', and mid grey corresponding to 'check texture' (i.e. partially present). In turn, these have been grouped into larger triangular sets of 4 adjacent sub-triangles. FIG. 3b shows 64 of these larger triangular sets. These larger triangular sets can be referred to as "vectors" or "sub-blocks". As examples, 322 is a vector comprising four 'fully present' sub-triangles, 324 is a vector of four 'fully absent' indications, and 326 is a vector of four 'check texture' indications.

Other vectors are not uniform: 328 has three 'fully absent' and one 'check texture' indication while 330 has one 'fully opaque' and three 'check texture' indications.

Further, given a sensible assumption that the presence map is continuous/bandwidth limited, i.e. one cannot go immediately from "fully present" to "fully absent" without some transitional "check texture" state—due to either interpolation in texture reconstruction or the desire to avoid aliasing due to unrepresentable frequency content—then there are fewer than 81 (i.e. $3^4$) possible patterns one might expect for a vector. Enumerating the possible cases gives 31 cases, which can be uniquely indicated using 5 bits per vector. Given the 64 vectors in the example, this uses 320 bits.

Figure 3C:
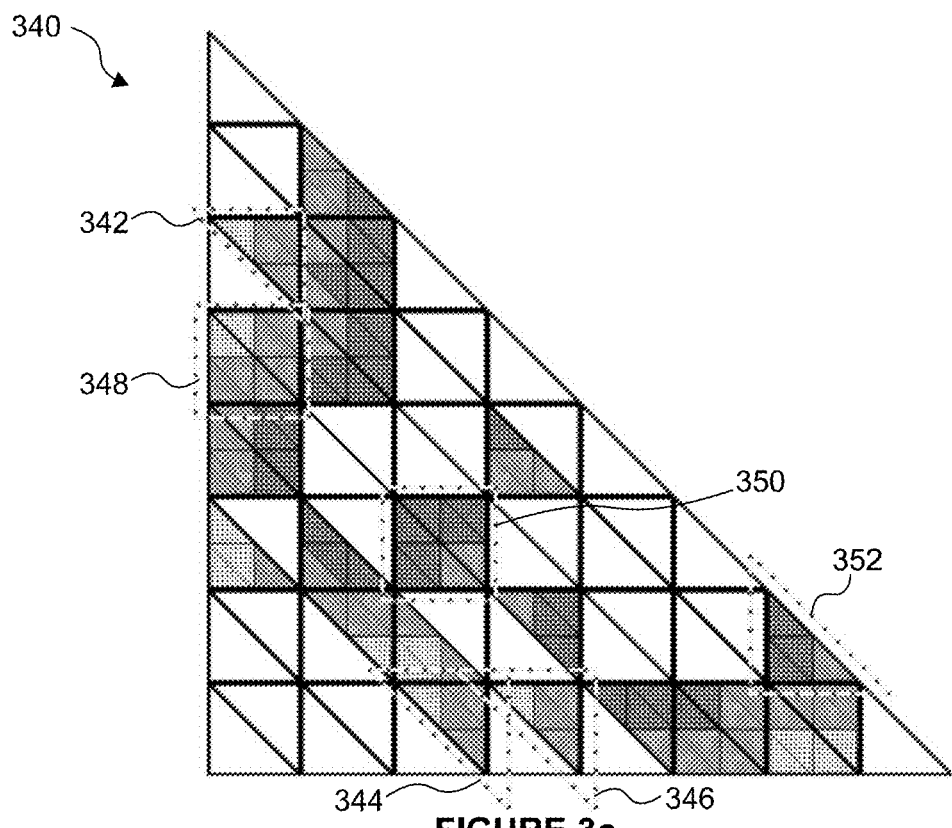
FIG. 3c shows the presence indications shown in FIG. 3b with sub-blocks having uniform presence state having been cleared.

The inventors have appreciated that there is often frequent recurrence of the same 'patterns' in the set of vectors. To make this simpler to visualise, the very frequently occurring uniform cases, e.g. such as those matching to 2010 2011 and 2012, in 2100 have been 'blanked out' to produce 340 as shown in FIG. 3c. Some of the remaining (non-uniform) vectors have been denoted in FIG. 3c with references 342, 344, 346, 348, 350 and 352 respectively. Consider vector 342: the same pattern reoccurs at 344 and 346, and allowing for reflection along the diagonal edge, it also occurs in two neighbouring vectors shown by 348. Similarly, 350 and 352 show three occurrences of a different pattern.

Given the frequent recurrence of patterns, a scheme related to VQ (vector quantisation) may be employed to represent the presence map more compactly, albeit at the possible risk of some additional check texture states. In this example, each vector is replaced with a 3-bit index that is used to index into a LUT/codebook. The codebook may represent a number of vectors, e.g. using 5 bits per vector. As an example, the first 3 index values, i.e. 0 through 2, may implicitly reference the three 'uniform' vectors, such as those matching 322, 324 and 326, and five additional vectors indexed by, e.g. 3, 4, 5, 6 and 7 are explicitly stored at a cost of 5×5 bits. The entire map can thus be represented with 64×3+5×5=217 bits. Prior to compression, the 256 uncompressed presence indications shown in FIG. 3b are represented with 512 bits, so compressing these presence indications down to 217 bits represents a compression ratio of 42% (where the compression ratio is defined as the compressed size of the data divided by the uncompressed size of the data). As this scheme can be lossy, on occasions a vector may need to reference one in the code book that is not identical but is 'compatible'. The meaning of compatible is defined later in this document.

Figure 6A:
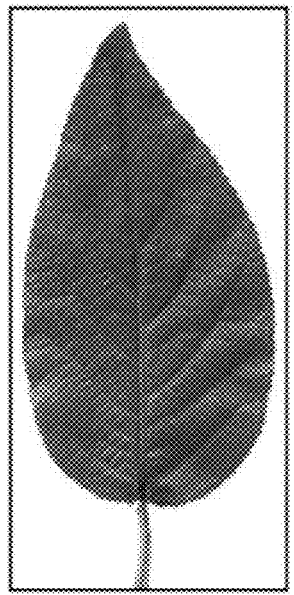
FIG. 6a shows a first object which has partial presence.
Figure 6B:
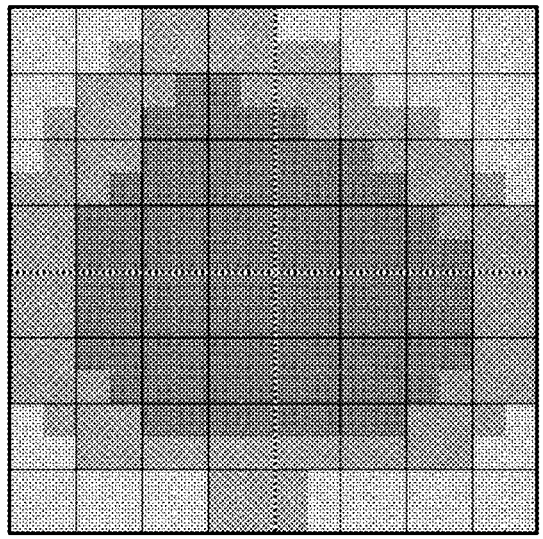
FIG. 6b shows a block of presence indications for the first object, the block of presence indications comprising 64 2×2 sub-blocks of presence indications.

The inventors have additionally appreciated the following: Firstly, triangles are rarely isolated but are typically joined to others along common shared edges and so can frequently be grouped at least as pairs, each pair sharing a common edge. Single triangles could be represented as a 'pair' where the second triangle is degenerate or flagged as not present. Secondly, the presence map of a pair of triangles can be represented as a square where one of the diagonals corresponds to the shared edge. Note that, although in world or model space these triangles are often of different sizes, one may consider their representation in, say, barycentric coordinates, allowing the pair to be mapped contiguously to a square. Due to continuity, the presence status in local areas on either side of that diagonal should be the same. Thirdly, it is easier to index into a set of sub-squares in a square map than to index into sub-triangles in a triangular map. Taking FIG. 1 as an example of a pair of adjacent triangles to which a leaf texture has been applied, FIG. 6b represents a 16×16 presence map for that triangle pair.

Figure 4:
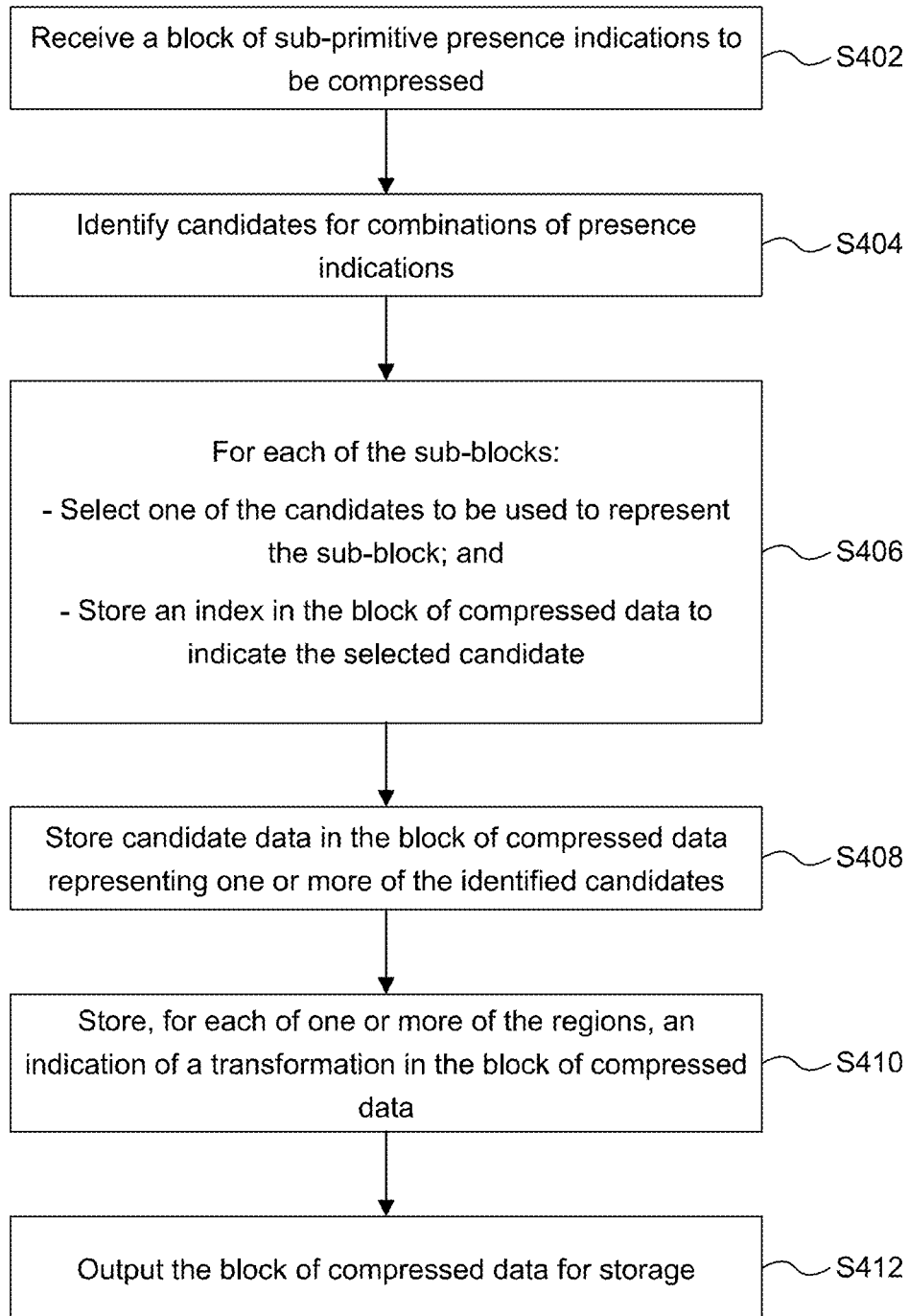
FIG. 4 is a flow chart for a method of compressing a block of sub-primitive presence indications into a block of compressed data.

Given the above, another method of compressing a block of sub-primitive presence indications into a block of compressed data is described with reference to the flow chart of FIG. 4. This compression is performed by the compression unit 316. FIG. 5 shows an example of a block of compressed data 500 that results from performing the method shown in FIG. 4.

In step S402 the compression unit 316 receives a block of sub-primitive presence indications to be compressed. The block of sub-primitive presence indications comprises a plurality of sub-blocks of sub-primitive presence indications. For example, FIG. 6a shows a first object which has partial presence. In this example the object is a leaf and is represented with a pair of triangular primitives that form a quad because they share an edge. FIG. 6b shows a block of presence indications for the first object which is received at the compression unit 316. The object is divided into 256 sub-primitives arranged in a 16×16 square. The block of presence indications comprises 64 2×2 sub-blocks of presence indications for respective sub-primitives. In other examples, the block may have a different number of sub-primitives and they may be arranged into other shapes (e.g. rectangles, or triangles), and/or the sub-blocks may have a different number of sub-primitives and they may be arranged into other shapes (e.g. rectangles, or triangles). In FIG. 6b each presence indication is represented with one of three hatchings to represent one of the three possible presence states. In particular, presence indications that indicate that a respective sub-primitive is fully present are represented with dark hatching; presence indications that indicate that a respective sub-primitive is fully absent are represented with light hatching; and presence indications that indicate that a respective sub-primitive is partially present are represented with mid-level hatching. As mentioned above, the presence indications that are received in step S402 may be determined in a pre-processing step, which may be performed by an Application Programming Interface (API) or as part of a process of creating the primitives and textures, e.g. by a user. Each of the (uncompressed) sub-primitive presence indications is represented with 2 bits to indicate one of the three presence states: (i) fully present, (ii) fully absent, or (iii) partially present.

In step S404 the compression unit 316 identifies a plurality of candidates for combinations of presence indications. These candidates may be referred to as "vectors". The combinations of presence indications are candidates for sub-blocks, i.e. they may be referred to as "sub-block combinations" and the candidates may be referred to as "sub-block candidates". The sub-block combinations are combinations of presence indications for a sub-block. This means that each candidate for a combination of presence indications has the same number and arrangement of presence indications as each of the sub-blocks. For example, if the sub-blocks have a 2×2 arrangement of presence indications (as in FIG. 6b) then each of the candidates has a 2×2 arrangement of presence indications.

At least some of the candidates may be identified in step S402 by analysing the sub-primitive presence indications in the block to find common sub-blocks having the same combinations of presence indications. In particular, combinations of presence indications that are repeated the most often in the block of sub-primitive presence indications may be selected to be the candidates in order to have the highest number of sub-blocks represented by a corresponding candidate.

Some candidates are used frequently in most blocks of presence indications. In particular, sub-blocks in which all of the presence indications are of the same state (e.g. all present, all absent or all partially present) are useful for most blocks of presence indications. For example, in FIG. 6b, out of the 64 sub-blocks, 18 are fully present, 11 are fully absent, 13 are fully partially present, while 22 have a mix of presence states. So the candidates representing sub-blocks in which all of the presence indications are the same may be identified as candidates without necessarily analysing the block of presence indications.

Figure 6C:
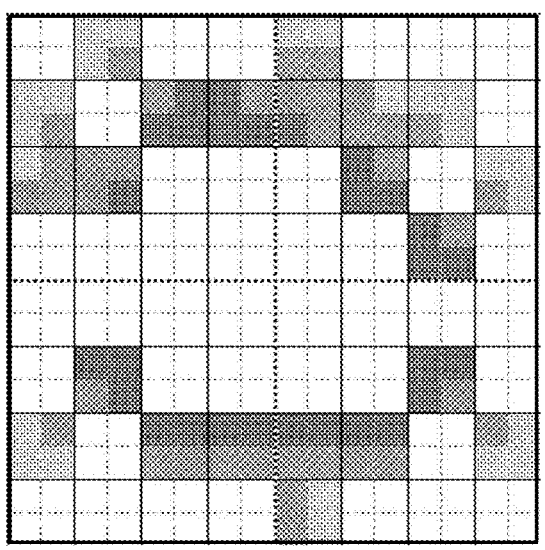
FIG. 6c shows the block of presence indications for the first object, with sub-blocks having a uniform presence state having been cleared.

FIG. 6c shows the block of presence indications for the first object, with the 42 sub-blocks having a uniform presence state having been cleared, such that the remining 22 sub-blocks are shown. These remaining sub-blocks are analysed to identify suitable candidates to use for the sub-blocks of presence indications in the block.

It is noted that, in order to achieve compression at a useful compression ratio, the number of candidates that are identified in step S404 is significantly fewer than the number of possible combinations of presence indications. For example, when there are four presence indications in a sub-block, and each presence indication may have one of three presence states, then there are 81 combinations of presence indications for a sub-block ($3^4$=81). However, as described above, given an assumption that a fully present sub-primitive cannot share an edge or a vertex with a fully absent sub-primitive, and noting that all four of the sub-primitives within a sub-block share a vertex in the example shown in FIG. 6b, a sub-block cannot include both a fully present sub-primitive and a fully absent sub-primitive. As such, there are just 31 combinations of presence indications which can occur. However, the number of candidates that are identified may be less than 31, e.g. approximately 10.

In step S406 the compression unit 316 selects, for each of the sub-blocks in the block of sub-primitive presence indications, one of the identified candidates to be used to represent the sub-block. In particular, a candidate which is compatible (e.g. the (or one of the equally) most compatible) with the presence indications in the sub-block is selected. If the presence indications in a sub-block match (i.e. are the same as) the presence indications in a candidate then that candidate is automatically perfectly compatible with the presence indications in the sub-block, and so that candidate will be selected. However, since the number of candidates is significantly less than the number of possible combinations of presence indications in a sub-block, some sub-blocks might not have a candidate that is exactly matching. A presence state which is fully present or fully absent in a sub-block is compatible with a presence state of partially present in a candidate in the sense that, although a check texture operation will be required, the final outcome will be the same Therefore, a candidate is compatible with the presence indications in a sub-block if it is identical to the sub-block or if one of more of the fully present or fully absent presence indications in the sub-block are replaced with a partially present state in the candidate. This can be written mathematically by describing the candidate as a vector: $A=(A_0, A_1, A_2, A_3)$, and describing the sub-block as a vector: $B=(B_0, B_1, B_2, B_3)$, where the components of the vectors represent presence states as fully present (denoted "FP"), fully absent (denoted "FA") or partially present (denoted "PP"). According to this notation, vector A is compatible with vector B if, and only if,:

$$\forall i \in \{0,1,2,3\} \ (A_i = B_i) \vee ((A_i = PP) \wedge B_i \in \{FP, FA\}).$$

It is acceptable for a presence state of fully present or fully absent to be represented as partially present because this will not result in a rendering error in the intersection testing process. Instead it means that the intersection testing process will check the texture to determine the presence of the primitive at an intersection point with a sub-primitive. So an opportunity to reduce the latency of the intersection testing process by using the sub-primitive indications has been lost due to the lossy nature of the compression applied to the presence indications, but no rendering errors will occur, so this is acceptable. It would not be acceptable for a presence state of fully present or partially present to be represented as fully absent, or for a presence state of fully absent or partially present to be represented as fully present because this may result in a rendering error in the intersection testing process. For a given sub-block S, given compatible candidates, X & Y, then X can be considered to be more compatible than Y if X has a higher compatibility score where the compatibility score between a candidate, C, and a sub-block/vector S is defined as $$\text{Compatibility } (C, S) = \sum_{i=0}^{3} \begin{cases} \text{if } C_i = S_i & 1 \\ \text{else} & 0 \end{cases}$$

A candidate in which all of the presence states are partially present is compatible with any sub-block so it can always be used as a fallback, but it is preferred to keep as many FP and FA presence indications as possible because that is where the benefit of using presence indications arises.

Note that a higher resolution presence map usually has a higher proportion of fully present or fully absent indications (relative to the more 'costly' check texture indications) and thus, given a fixed memory/storage budget, having a higher resolution albeit lossy scheme is likely to be superior, from a performance perspective, to a lower resolution but lossless scheme.

Also in step S406 the compression unit stores, in the block of compressed data 500, an index to indicate the selected candidate for each of the sub-blocks. The indices are denoted 502 in the block of compressed data 500 shown in FIG. 5. The index for a sub-block is a T-bit index. This means that the index for a sub-block can indicate one of 2T different candidates for that sub-block. In examples described herein, to achieve moderate compression, the value of T is less than the number of sub-primitive presence indications in one of the sub-blocks. As an example, when each of the sub-blocks comprises four sub-primitive presence indications, T is set to be less than or equal to 3 to achieve a good level of compression. To avoid quantising the presence indications it is preferable for T not to be too low. So as an example, T may be 3. When T=3, the index for a sub-block can indicate one of 8 different candidates for that sub-block. In other examples, there may be a different number of sub-primitive presence indications in a sub-block and/or T may have a value which is different to 3.

In step S408 the compression unit 316 stores, in the block of compressed data 500, candidate data 504 representing one or more of the candidates. For example, the candidate data representing one or more of the candidates may be stored in a respective one or more entries in a codebook in the block of compressed data. In some examples, at least one of the candidates (e.g. candidates which represent sub-blocks whose sub-primitive presence indications are all the same) is not represented by candidate data stored in the block of compressed data. For example, the fully present, fully absent and fully partially present candidates may be so common that they do not need to be explicitly stored in the codebook, but the other identified candidates are stored in the codebook.

In the example in which each of the sub-blocks has four presence indications in a 2×2 arrangement (as shown in FIG. 6b), all of the sub-primitives represented by the sub-block share a vertex (in the middle of the 2×2 arrangement). Gradients in alpha values of textures are finite, so since all of the sub-primitives in the sub-block meet at a single point, it is impossible to have both fully present sub-primitives and fully absent sub-primitives in the same sub-block in this 2×2 example. In this example, each of the candidates for which candidate data is stored in the block of compressed data 500, can be represented with five bits of candidate data:
  one bit to indicate one of: (i) a first palette of fully present and partially present, and (ii) a second palette of fully absent and partially present; and
  one bit for each of the four presence indications of the candidate to indicate either partially present or the other state of the indicated palette.

Increasing the number of candidates in the codebook is useful because it allows for a greater number of candidates, so better matches with the sub-blocks that the candidates are used to represent may be available. This means that fewer presence indications that are fully present or fully absent would need to be represented as partially present in a candidate. However, in terms of the size of the compressed data, it is not beneficial to increase the number of bits (T) used for the indices. If the number of candidates in the codebook is increased but T is not increased then the number of candidates that are available for selection for a particular sub-block within a block of presence indications can be kept at $2^T$, but different candidates may be available to different ones of the sub-blocks within the block of presence indications. In particular, different candidates may be more suitable for different sub-blocks based on the spatial position of the sub-block within the block. In particular, the block of sub-primitive presence indications may be divided into a plurality of regions (e.g. quadrants), with each of the regions (e.g. quadrants) comprising a plurality of the sub-blocks. One or more of the identified candidates may be region-specific candidates such that they are candidates for sub-blocks within only one (or within a subset, but not all) of the regions of the block. However, some of the identified candidates may be global candidates such that they are candidates for sub-blocks within all of the regions of the block. Note the choice of placing a candidate in either a region specific or global set based on distribution is intended as a 'rule of thumb' that is likely to yield better results but is not mandatory.

For example, the candidate data 504 shown in the block of compressed data 500 in FIG. 5 comprises candidate data 508 for one or more global candidates and candidate data $510_1$, $510_2$, $510_3$ and $510_4$ for one or more region-specific candidates for each of four regions in the block of presence indications. In an example described below, the candidate data 504 stored in the block of compressed data 500 has: (i) candidate data representing three global candidates, and (ii) candidate data representing two region-specific candidates for each of four regions. In other examples (not described in detail herein) the candidate data stored in the block of compressed data has: (i) candidate data representing four global candidates, and (ii) candidate data representing one region-specific candidate for each of four regions.

In the example shown in FIG. 6b, four regions (quadrants) are shown: (i) a top left quadrant which includes 16 sub-blocks in the top left quadrant of the block, (ii) a top right quadrant which includes 16 sub-blocks in the top right quadrant of the block, (iii) a bottom left quadrant which includes 16 sub-blocks in the bottom left quadrant of the block, and (iv) a bottom right quadrant which includes 16 sub-blocks in the bottom right quadrant of the block. Note that FIG. 6c is essentially a simplified representation of 6b in which those sub-blocks that are uniform, i.e. one of all present, all absent, or all partially present, have been 'cleared' for illustrative purposes.

Figure 6D:
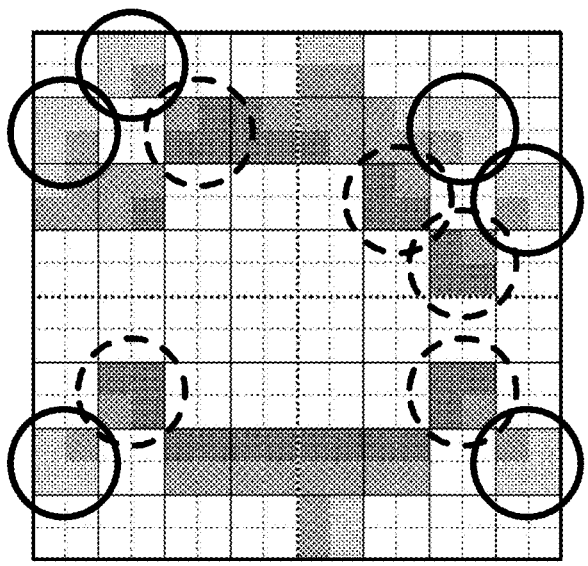
FIG. 6d shows the block of presence indications for the first object that is shown in FIG. 6c, with some of the sub-blocks which exhibit symmetry being highlighted.

FIG. 6d shows the block of presence indications for the first object that is shown in FIG. 6c, with some of the sub-blocks which exhibit symmetry being highlighted. In particular, there are two sub-blocks in the top left quadrant of the block which have been circled with a solid circle, and these two sub-blocks have three sub-primitive presence indications indicating absent sub-primitives and one sub-primitive presence indication indicating a partially present sub-primitive, with the partially present sub-primitive being in the bottom right of the 2×2 sub-block. Similarly, there are two sub-blocks in the top right quadrant of the block which have been circled with a solid circle, and these two sub-blocks have three sub-primitive presence indications indicating absent sub-primitives and one sub-primitive presence indication indicating a partially present sub-primitive, with the partially present sub-primitive being in the bottom left of the 2×2 sub-block. There is one sub-block in the bottom left quadrant of the block which has been circled with a solid circle, and this sub-block has three sub-primitive presence indications indicating absent sub-primitives and one sub-primitive presence indication indicating a partially present sub-primitive, with the partially present sub-primitive being in the top right of the 2×2 sub-block. There is one sub-block in the bottom right quadrant of the block which has been circled with a solid circle, and this sub-block has three sub-primitive presence indications indicating absent sub-primitives and one sub-primitive presence indication indicating a partially present sub-primitive, with the partially present sub-primitive being in the top left of the 2×2 sub-block. It can be seen that although these sub-blocks are not all the same, there is some symmetry between these sub-blocks. In particular, relative to the sub-blocks indicated with solid circles in the top left quadrant: (i) the sub-blocks indicated with solid circles in the top right quadrant are rotated by 90 degrees clockwise, (ii) the sub-block indicated with a solid circle in the bottom left quadrant is rotated by 90 degrees anticlockwise, and (iii) the sub-block indicated with a solid circle in the bottom right quadrant is rotated by 180 degrees.

Similarly, the sub-blocks indicated with dashed circles in FIG. 6d also exhibit symmetry that depends upon the quadrant in which the sub-blocks are located. Each of the sub-blocks indicated with a dashed circle has three sub-primitive presence indications indicating fully present sub-primitives and one sub-primitive presence indication indicating a partially present sub-primitive. There is one sub-block in the top left quadrant of the block which has been circled with a dashed circle, and this sub-block has three sub-primitive presence indications indicating present sub-primitives and one sub-primitive presence indication indicating a partially present sub-primitive, with the partially present sub-primitive being in the top left of the 2×2 sub-block. There are two sub-blocks in the top right quadrant of the block, one sub-block in the bottom left quadrant of the block and one sub-block in the bottom right quadrant of the block which have been circled with a dashed circle. Relative to the sub-block indicated with a dashed circle in the top left quadrant: (i) the sub-blocks indicated with dashed circles in the top right quadrant are rotated by 90 degrees clockwise, (ii) the sub-block indicated with a dashed circle in the bottom left quadrant is rotated by 90 degrees anticlockwise, and (iii) the sub-block indicated with a dashed circle in the bottom right quadrant is rotated by 180 degrees.

The sub-blocks within a block often exhibit symmetry that depends upon the quadrant in which the sub-blocks are located because often textures and primitives that have partial presence will represent geometry that has some symmetrical structure, e.g. leaves or fences, and the structure tends to be positioned approximately in the centre of the texture/primitive. This symmetry can be exploited to make better use of global candidates. For example, a first global candidate could be stored and used (during decompression) for all of the sub-blocks indicated with a solid circle in FIG. 6d with a quadrant-dependent transformation (e.g. rotation and/or reflection) being applied to the first global candidate so that it matches each of the sub-blocks indicated with a solid circle. Similarly, a second global candidate could be stored and used (during decompression) for all of the sub-blocks indicated with a dashed circle in FIG. 6d with a quadrant-dependent transformation (e.g. rotation and/or reflection) being applied to the second global candidate so that it matches each of the sub-blocks indicated with a dashed circle.

In step S410 the compression unit 316 stores, in the block of compressed data 500, for each of one or more of the regions, an indication of a transformation to be applied to candidate data representing candidates for sub-blocks within that region. The transformation could be one or both of a rotation and a reflection. If there are R regions in the block then an indication of a transformation may be stored for (R−1) of the regions. In the main examples described herein the regions are quadrants of the block (such that R=4), but in other examples the regions could be something other than quadrants. The indications of the transformations are denoted as 506 in FIG. 5. Each indication of a transformation may, for example, have 2 or 3 bits.

As an example, with reference to the example shown in FIGS. 6a to 6d, no transformation indication is stored for the top left quadrant, a transformation indication indicating a rotation of 90 degrees clockwise is stored for the top right quadrant, a transformation indication indicating a rotation of 90 degrees anticlockwise is stored for the bottom left quadrant, and a transformation indication indicating a rotation of 180 degrees is stored for the bottom right quadrant.

In step S412 the compression unit 316 outputs the block of compressed data 500 for storage. The block of compressed data 500 may be stored with the primitive data for the primitive, e.g. in the geometry data source 303. The block of compressed data may be passed with the primitive data for the primitive to the ray tracing unit 302 and may be stored in the memory 304 and/or in memory within the intersection testing module 308 for use by the primitive intersection testing unit(s) 314 as part of performing intersection testing for a ray with respect to the primitive.

Figure 7A:
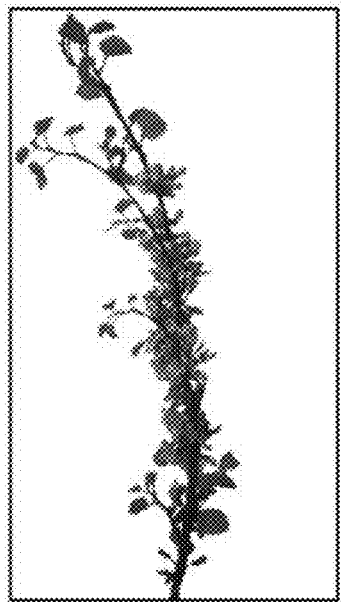
FIG. 7a shows a second object which has partial presence.
Figure 7B:
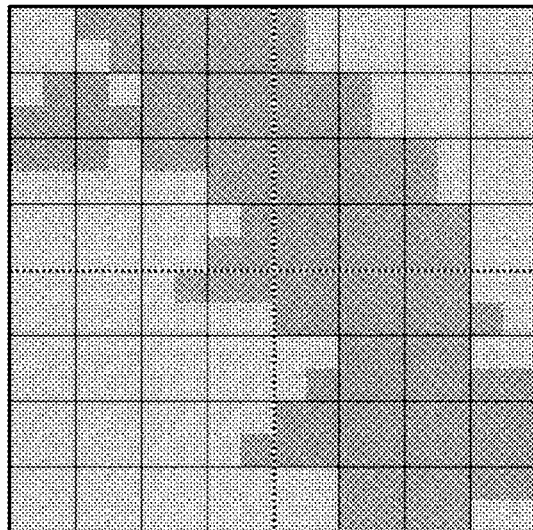
FIG. 7b shows a block of presence indications for the second object, the block of presence indications comprising 64 2×2 sub-blocks of presence indications.

As another example, FIG. 7a shows a second object which has partial presence. In this example the object is a plant and is represented with a pair of triangular primitives that form a quad because they share an edge. Note that the actual pair of triangles used are of a smaller size than shown by the rectangle of the image so that it more tightly bounds the visible portions of the plant. In particular, the right hand edge has been moved towards the left. FIG. 7b shows a block of presence indications for the second object which is received at the compression unit 316. The examples of the blocks of presence indications described herein (e.g. shown in FIGS. 6b, 7b and 11) are trimmed from the top, left, right and bottom to find the opaque or partially transparent boundaries. As in the first example described above, each of the (uncompressed) sub-primitive presence indications is represented with 2 bits to indicate one of the three presence states: (i) fully present, (ii) fully absent, or (iii) partially present. The second object is divided into 256 sub-primitives arranged in a 16×16 square. The block of presence indications comprises 64 2×2 sub-blocks of presence indications for respective sub-primitives. In FIG. 7b there are no sub-primitives that are fully present, so each presence indication is represented with one of two hatchings to represent one of the two remaining presence states. In particular, presence indications that indicate that a respective sub-primitive is fully absent are represented with light hatching; and presence indications that indicate that a respective sub-primitive is partially present are represented with mid-level hatching.

Figure 7C:
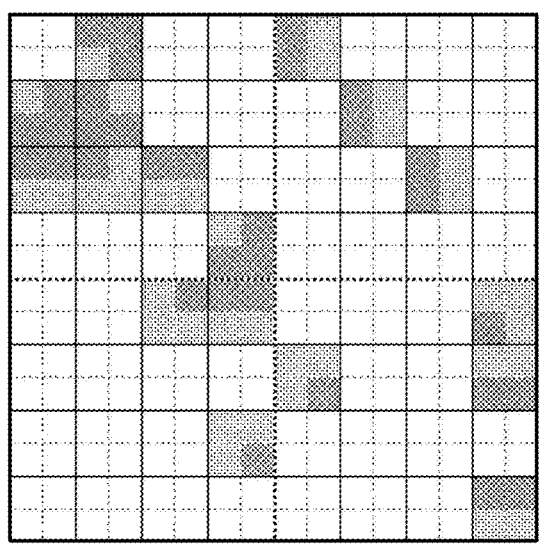
FIG. 7c shows the block of presence indications for the second object, with sub-blocks having a uniform presence state having been cleared.

In FIG. 7b, out of the 64 sub-blocks, zero are fully present, 25 are fully absent, are 22 fully partially present, while 17 have a mix of presence states. FIG. 7c shows the block of presence indications for the second object, with the 47 sub-blocks having a uniform presence state having been cleared, such that the remining 17 sub-blocks are shown. These remaining sub-blocks can be analysed to identify suitable candidates to use for the sub-blocks of presence indications in the block.

Figure 7D:
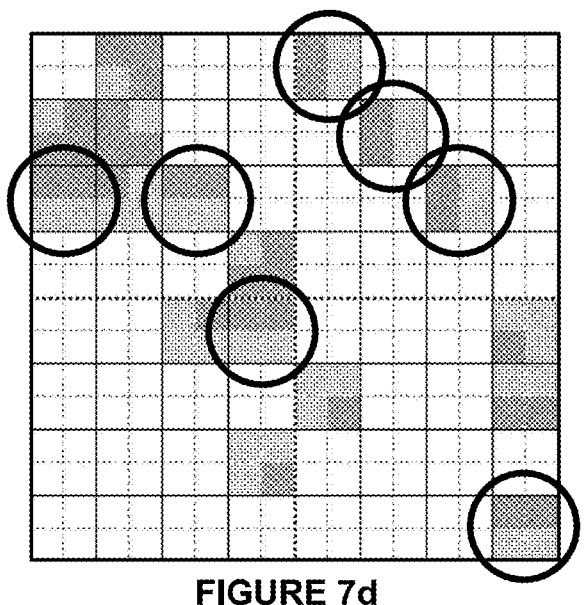
FIG. 7d shows the block of presence indications for the second object that is shown in FIG. 7c, with some of the sub-blocks which exhibit symmetry being highlighted.

FIG. 7d shows the block of presence indications for the second object that is shown in FIG. 7c, with some of the sub-blocks which exhibit symmetry being highlighted. In particular, there are two sub-blocks in the top left quadrant of the block which have been circled with a solid circle, and these two sub-blocks have two sub-primitive presence indications indicating absent sub-primitives and two sub-primitive presence indications indicating partially present sub-primitives, with the partially present sub-primitives being in the top left and top right of the 2×2 sub-block. Similarly, there are three sub-blocks in the top right quadrant of the block which have been circled with a solid circle, and these three sub-blocks have two sub-primitive presence indications indicating absent sub-primitives and two sub-primitive presence indications indicating partially present sub-primitives, with the partially present sub-primitives being in the top left and bottom left of the 2×2 sub-block. There is one sub-block in the bottom left quadrant of the block which has been circled with a solid circle, and this sub-block has two sub-primitive presence indications indicating absent sub-primitives and two sub-primitive presence indications indicating partially present sub-primitives, with the partially present sub-primitives being in the top left and top right of the 2×2 sub-block. There is one sub-block in the bottom right quadrant of the block which has been circled with a solid circle, and this sub-block has two sub-primitive presence indications indicating absent sub-primitives and two sub-primitive presence indications indicating partially present sub-primitives, with the partially present sub-primitives being in the top left and top right of the 2×2 sub-block. It can be seen that relative to the sub-blocks indicated with solid circles in the top left quadrant: (i) the sub-blocks indicated with solid circles in the top right quadrant are rotated by 90 degrees anticlockwise, (ii) the sub-block indicated with a solid circle in the bottom left quadrant is has not been transformed, and (iii) the sub-block indicated with a solid circle in the bottom right quadrant has not been transformed. Note that for 4 quadrants, only 3 transformations indications need be stored, so in this example, the top left quadrant is the reference quadrant, i.e. there is no transformation indication stored for this quadrant, a transformation indication indicating a rotation of 90 degrees anticlockwise may be stored for the top right quadrant, a transformation indication indicating an identity transformation may be stored for the bottom left quadrant, and a transformation indication indicating an identity transformation may be stored for the bottom right quadrant.

It is noted that there is another sub-block in the bottom right quadrant (two sub-blocks above the circled one) with two sub-primitive presence indications indicating partially present sub-primitives and two sub-primitive presence indications indicating absent sub-primitives, but the arrangement of the indications in that (uncircled) sub-block is not the same as the arrangement in the circled sub-block in the bottom right quadrant. In the example described in detail herein, a single transformation indication is stored for a quadrant, so a single candidate cannot be used to exactly match both of these sub-blocks in this example. The choice of candidates and the transformations for the quadrants is a global optimisation problem to ideally find a best fit for all of the sub-blocks where best fit is defined as having as few forced compatibility replacements as possible. In this example, the uncircled sub-block may be represented using a different candidate (e.g. a compatible candidate, e.g. the fully partially present candidate). A measure of success of the global optimisation problem may be used to determine whether to accept a choice of candidates and transformations, where the measure of success may be based on a proportion of the presence indications that are accurately represented and/or the resulting size of the block of compressed data.

Each transformation indication may, for example, be represented with 2 bits to indicate one of a set of four transformations. For example, the four transformations may include: (i) the identity, i.e. no transformation, (ii) rotate 90 degrees clockwise, (iii) rotate 90 anticlockwise and (iv) rotate 180 degrees. In other examples, the transformations may include reflections, e.g. reflections over vertical, horizontal or diagonal axes. The set of four transformation that are available to choose from may be the same for each of the three quadrants (the top right quadrant, the bottom left quadrant and the bottom right quadrant), or the set of four transformation that are available to choose from might not be the same for each of the three quadrants.

In other examples, each transformation indication may be represented with fewer, or more, than 2 bits. For example, each transformation indication may be represented with 3 bits such that 8 options are available for each transformation indication. For example, the eight transformations may include: (i) the identity transformation, (ii) rotate 90 degrees clockwise, (iii) rotate 90 anticlockwise, (iv) rotate 180 degrees, (v) reflect over the vertical axis, (vi) reflect over the horizontal axis, (vii) reflect over the diagonal axis where x=y, or (viii) reflect over the diagonal axis where x=−y. The transformations are equivalent to permutations of the presence indications within a sub-block, and may be implemented with matrices or just with chains of multiplexer units in a transformation unit. Using multiplexer units is simple to implement in hardware and introduces very little latency into the processing.

Figure 16:
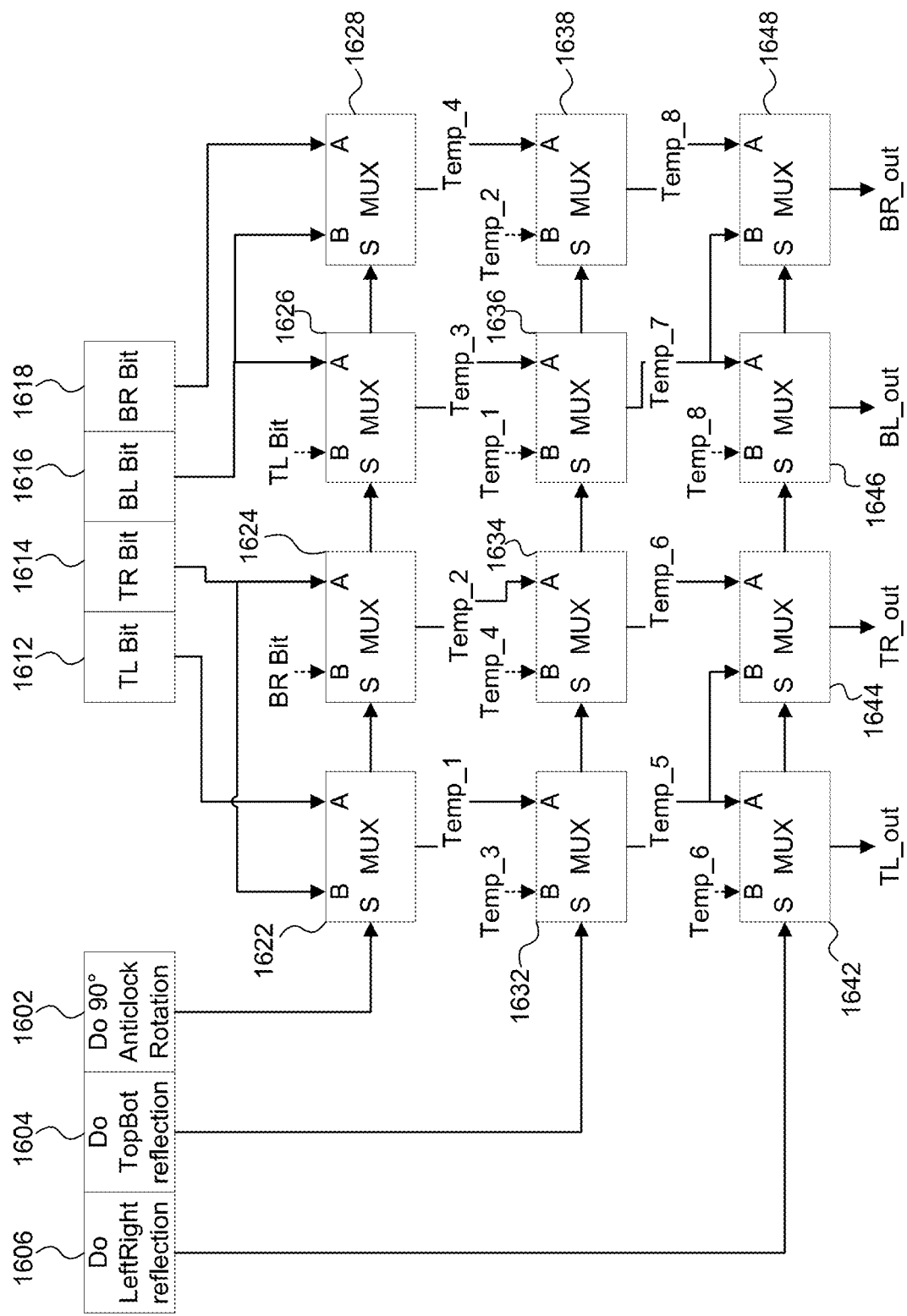
FIG. 16 shows a transformation unit for applying a transformation to a sub-block of sub-primitive presence indications.

FIG. 16 shows an example of such a transformation unit for applying a transformation to a sub-block of sub-primitive presence indications. This unit takes as inputs an encoding of the transformation comprising three, 1-bit flags: "Do 90 Anticlockwise Rotation" 1602 (which may be referred to as a 90 degree rotation flag), "Do Top/Bottom reflect" 1604

(which may be referred to as a vertical reflection flag) and "Do Left/Right reflect" 1606 (which may be referred to as a horizontal reflection flag), and four of the five bits encoding the sub-block corresponding to the four indications, i.e. the Top Left bit 1612, Top Right bit 1614, Bottom Left bit 1616, and Bottom Right bit 1618. The remaining $5^{th}$ bit of the 5-bit encoding, i.e. that which selects if the sub-block is a palette of either (a) Fully Present and/or partially present or (b) Fully Absent and/or partially present, is unaffected by this transformation process, and is not shown in FIG. 16. It is noted that although in this example the rotation is a 90 degree anticlockwise rotation, in other examples the rotation could be a 90 degree clockwise rotation.

The transformation unit comprises 3 layers each comprised of four, 2-input multiplexer ("MUX") units. Each of these MUX units has a select input, S, and two data inputs, A & B. If the S bit to a MUX unit is zero, then that MUX unit outputs the value provided by input A, else if S is one, it outputs the value of input B. In the first layer, the Select Bit, S, of each of the four MUX units 1622, 1624, 1626 and 1628, is connected to the "Do 90 Anticlockwise Rotation" flag 1602. The indication bits, 1612, 1614, 1616 and 1618 are respectively delivered to these MUX units (1622, 1624, 1626 and 1628) such that if "Do 90 Anticlockwise Rotation" is zero, the output of this layer, i.e. {Temp_1, Temp_2, Temp_3, Temp_4}, will effectively be the values of {TL, TR, BL, BR}, i.e. an identity transform. If, however, "Do 90 Anticlockwise Rotation" is one, the output will effectively be {TR, BR, TL, BL}, which corresponds to a rotation of 90 degrees in the clockwise direction.

The second layer of MUX units (1632, 1634, 1636 and 1638) have their select inputs connected to the "Do Top Bottom Reflection" flag 1604. These MUX units are connected to the respective outputs of layer 1, i.e. {Temp_1, Temp_2, Temp_3, Temp_4}, such that if "Do Top Bottom Reflection" is zero, an identity transform will be performed, i.e. the outputs of layer 2 {Temp_5, Temp_6, Temp_7, Temp_8} will have the values of {Temp_1, Temp_2, Temp_3, Temp_4}. If "Do Top Bottom Reflection" is one, then the outputs {Temp_5, Temp_6, Temp_7, Temp_8} will represent a reflection of the inputs about the horizontal axis, i.e. in effect the output values of layer 2 {Temp_5, Temp_6, Temp_7, Temp_8} will instead be that of {Temp_3, Temp_4, Temp_1, Temp_2}.

Similarly, the third layer of MUX units (1642, 1644, 1646 and 1648) have their select inputs connected to the "Do Left Right Reflection" flag 1606. These MUX units are connected to the respective outputs of layer 2, i.e. {Temp_5, Temp_6, Temp_7, Temp_8}, such that if "Do Left Right Reflection" is zero, an identity transform will be performed, i.e. the outputs of layer 3 {TL_out, TR_out, BL_out, BR_out} will have the values of {Temp_5, Temp_6, Temp_7, Temp_8}. If "Do Left Right Reflection" is one, then the outputs {TL_out, TR_out, BL_out, BR_out} will represent a reflection of the inputs about the vertical axis, i.e. in effect the output values of layer 3 {TL_out, TR_out, BL_out, BR_out} will instead be that of {Temp_6, Temp_5, Temp_8, Temp_7}. The outputs from layer 3 {TL_out, TR_out, BL_out, BR_out} are output from the transformation unit.

The combination of these three layers permits the encoding of 8 different transformations as summarised by

| Do Left Right Reflection | Do Top Bottom Reflection | Do 90° Anticlockwise Rotation | Equivalent Transformation |
| --- | --- | --- | --- |
| 0 | 0 | 0 | Identity (i.e. no transform) |
| 0 | 0 | 1 | Rotate 90 anticlockwise |
| 0 | 1 | 0 | Reflect Top/Bottom |
| 0 | 1 | 1 | Reflect about X = −Y diagonal |
| 1 | 0 | 0 | Reflect Left/Right |
| 1 | 0 | 1 | Reflect about the X = Y diagonal |
| 1 | 1 | 0 | Rotate 180 |
| 1 | 1 | 1 | Rotate 270 anticlockwise |

In an example with triangular sub-blocks, the same transformation process unit could still be employed. The individual transformations may not be 'geometrically' correct, but the process of shuffling the indication flags would still provide a means of creating alternative combinations of vectors.

An alternative "transformation" may also modify the values of the vector themselves. For example, a flag may indicate to "invert" the palette setting, i.e. such that a stored Fully Present and/or partially present candidate may be interpreted, for a given region, as a Fully absent and/or partially present sub-block. In another example, a 'transformation' flag may indicate that the indicator bits themselves should be inverted. These "invert" flags and "transformation" flags may be additional flags or stored in place of one or more of the reflection and rotation flags 1602, 1604, 1606.

As an example, in which a dual triangle may be represented with 64 bytes, there might be an additional budget of 32 bytes (256 bits) for a 16×16 block of presence indications (i.e. an average of 1 bit per presence indication, whereas the uncompressed presence indications each have 2 bits). To satisfy this budget, the presence indications need to be compressed to a size that is at most 50% of the original uncompressed data. In the 16×16 block, there are 64 2×2 blocks, wherein each 2×2 block is encoded with a T-bit index, so where T=3, the indices 502 use 192 bits (64*3=192) in the block of compressed data 500. There are three transformation indications 506 in this example (one for each of the top right, bottom left and bottom right quadrants of the block of presence indications). Each of the transformation indications may be represented with 3 bits, such that 9 bits are used for the transformation indications. So there are 55 remaining bits for the candidate data 504 in the block of compressed data 500 if it is going to meet the budget of 256 bits. As described above, each entry in the codebook uses 5 bits, so there is space to have 11 entries in the codebook, i.e. candidate data for 11 candidates in the block of compressed data, in addition to the three candidates (the fully present, fully absent and fully partially present candidates) which are so common that their candidate data does not need to be explicitly stored in the block of compressed data 500. In this example, candidate data 508 is stored in the block of compressed data for three global candidates, and for each of the four quadrants of the block of presence indications, candidate data ($510_1$, $510_2$, $510_3$ and $510_4$) is stored in the block of compressed data for two region-specific candidates.

In this example, each index has 3 bits so it can indicate one of a set of eight candidates. The quadrant-specific candidates that an index can indicate depend upon which of the quadrants the presence indication that the index relates to is within. Table 1 shows an example of what the different indices can represent. This is just one example, and the indices can be interpreted differently in different examples.

TABLE 1 example indices

| Index | Candidate |
|---|---|
| 0 | fully present |
| 1 | fully partially present |
| 2 | fully absent |
| 3 | first global candidate |
| 4 | second global candidate |
| 5 | third global candidate |
| 6 | first quadrant-specific candidate |
| 7 | second quadrant-specific candidate |

In some examples, if just 2 bits are used for each of the transformation indications, then there may be 3 bits available in the block of compressed data 500 for it to satisfy the budget of 256 bits. These three bits could be used to shift the boundaries between the different quadrants, so that the regions are not necessarily of equal size or shape.

An advantage of this compression scheme is that it is a fixed-length encoding scheme, i.e. the block of compressed data 500 has a fixed length and the data fields within the block are at predetermined locations. This is in contrast to other compression schemes which may be variable length encoding schemes wherein the compressed data has a variable length and thus data field locations are themselves dependent on the encoded data. Using a fixed-length encoding scheme means that random access to data within a block of compressed data is possible (i.e. it is possible to decompress some of the data within the block of compressed data without necessarily decompressing it all), and the implementation of the decompression unit 318 is simplified because the boundaries between the different fields within the block of compressed data are known, i.e. they do not depend on the data stored in those fields.

Random access is particularly useful for the purpose of determining the presence of a primitive at an intersection point when an intersection is found between a ray and the primitive because this allows the presence of the primitive at that point to be determined from the block of compressed data without necessarily decompressing all of the presence indications for the rest of the primitive (which are not needed).

Figure 8:
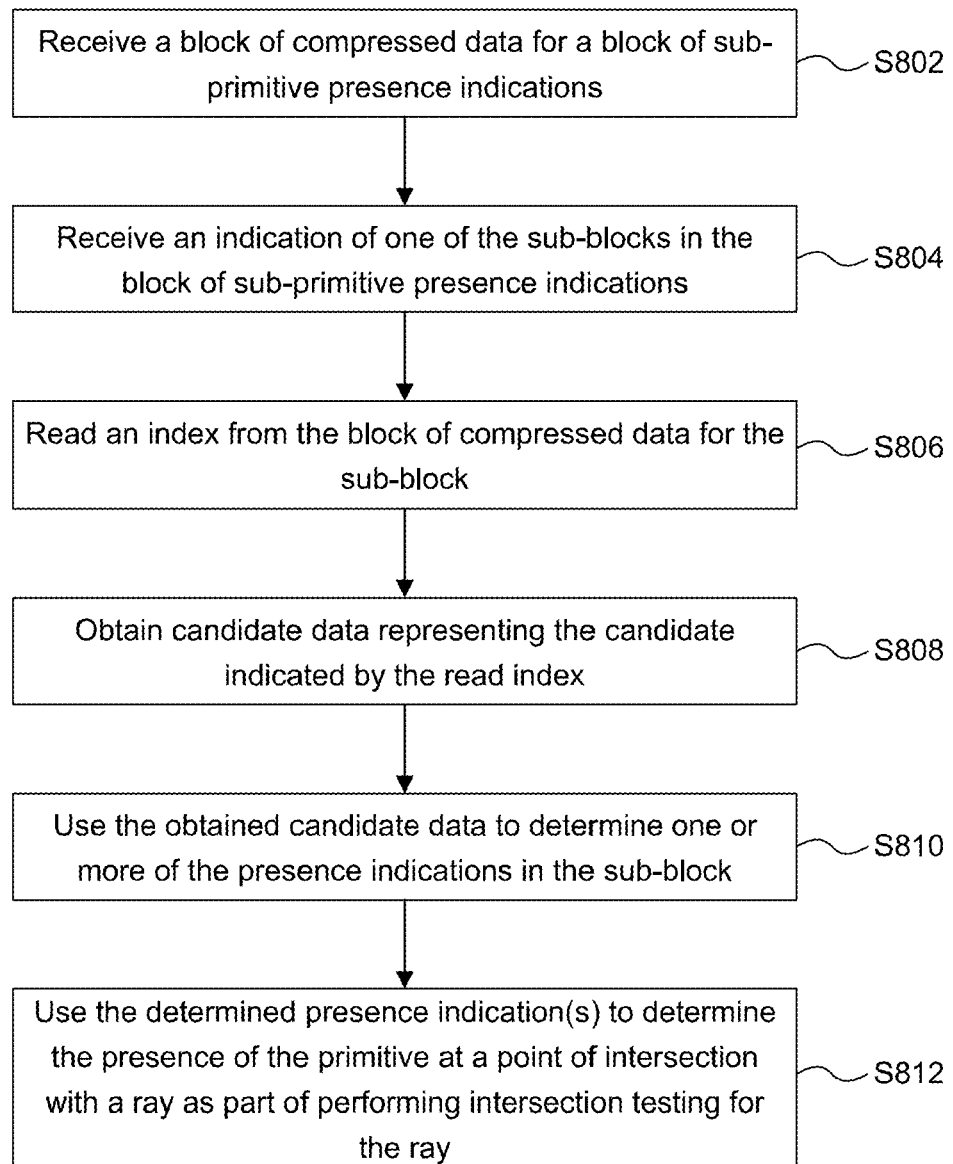
FIG. 8 is a flow chart for a method of decompressing compressed data to determine one or more sub-primitive presence indications for use in intersection testing.

A method, performed by the decompression unit 318, of decompressing compressed data to determine one or more sub-primitive presence indications for use in intersection testing in a ray tracing system is described with reference to the flow chart in FIG. 8.

Figure 9:
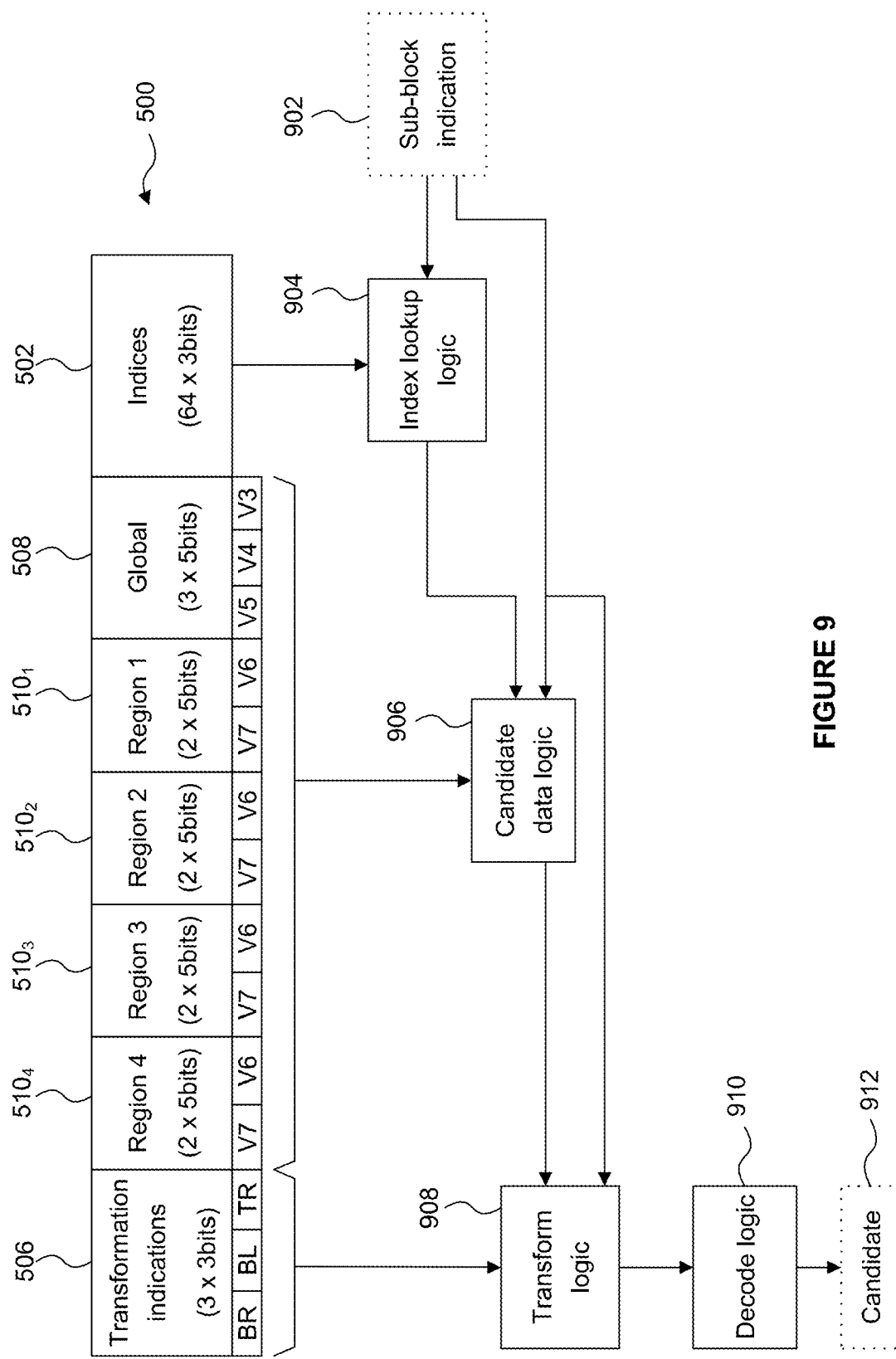
FIG. 9 shows a first example of logic within a decompression unit for decompressing compressed data to determine one or more sub-primitive presence indications for the first or second object.

FIG. 9 shows some of the logic in the decompression unit 318. In particular, the decompression unit 318 comprises index lookup logic 904, candidate data logic 906, transform logic 908 and decoder logic 910.

In step S802 the decompression unit receives a block of compressed data for a block of sub-primitive presence indications. FIG. 9 shows the block of compressed data 500 which has been created as described in the example given above. As described above, in this example, the block of compressed data 500 comprises, for each of the sub-blocks in the block of sub-primitive presence indications, an index to indicate one of a plurality of candidates for combinations of presence indications. In the example described above, there are 64 2×2 sub-blocks within the block of presence indications, and the indices 502 each have 3 bits. In this example, the block of compressed data 500 comprises candidate data for three global candidates 508 and for two quadrant-specific candidates ($510_1$, $510_2$, $510_3$ and $510_4$) for each of the quadrants of the block of presence indications. The data for a candidate has 5 bits. There are three transformation indications 506 in the block of compressed data, where in this example each of the transformation indications has 3 bits.

In step S804 the decompression unit 318 receives an indication of one of the sub-blocks in the block of sub-primitive presence indications. In particular, the decompression unit 318 receives a sub-block indication 902 at the index lookup logic 904. In the example in which the block of presence indications has 64 sub-blocks arranged in an 8×8 arrangement, the sub-block indication may have 6 bits: 3 bits to indicate an x coordinate of the sub-block and 3 bits to indicate a y coordinate of the sub-block within the block of presence indications.

In step S806 the decompression unit 318 reads an index from the block of compressed data for one of the sub-blocks in the block of sub-primitive presence indications. In particular, the index lookup logic 904 reads an index from the indices 502 for the sub-block that is indicated by the sub-block indication 902.

In step S808 the decompression unit 318 obtains candidate data representing at least a portion of the candidate indicated by the index that was read in step S806. For example, in step S808 the decompression unit 318 may obtain candidate data representing the candidate indicated by the index that was read in step S806. The candidate data logic 906 is configured to receive the index from the index lookup logic 904 and to receive an indication of the region (e.g. quadrant) of the sub-block. The quadrant of the sub-block can be represented with two bits of the sub-block indication 902: the most significant bit (MSB) of the x coordinate of the sub-block and the MSB of the y coordinate of the sub-block, e.g. such that (0,0) would represent the top left quadrant. The candidate data logic 906 may receive the full sub-block indication 902 or just the MSBs of the x and y coordinates of the sub-block from the sub-block indication 902. In other examples, the quadrant of the sub-block could be represented with different bits to the example given above.

As described above, some of the candidates (e.g. candidates representing a sub-block whose sub-primitive presence indications are all the same) are so common that their candidate data does not need to be explicitly stored in the block of compressed data 500 for those candidates. For these candidates, step S808 may comprise obtaining predetermined candidate data indicated by the read index. For example, the decompression unit 318 may be configured (e.g. in fixed function circuitry) to interpret some of the indices as indicating particular candidates without reading candidate data from the block of compressed data 500. For example, the indices may be interpreted according to Table 1 shown above, in which case the candidate data logic 906 will interpret an index of 0 as representing a fully present candidate, an index of 1 as representing a fully partially present candidate, and an index of 2 as representing a fully absent candidate. As described above, the candidate data representing a candidate may have 5 bits.

If the index indicates a candidate for which candidate data is stored in the block of compressed data 500 then step S808 comprises reading the candidate data from the block of compressed data. As described above, the candidate data may be for a global candidate (candidate data 508) or for a region-specific candidate (candidate data $510_1$, $510_2$, $510_3$ or $510_4$). If the index indicates a region-specific candidate then the candidate data logic 906 uses the indication of the region from the sub-block indication 902 to determine which of the region-specific candidates to read the candidate data for from the block of compressed data.

In step S810 the decompression unit 318 uses the obtained candidate data to determine one or more of the presence indications in the sub-block. For example, the transform logic 908 and the decode logic 910 can be used to determine the presence indications in the sub-block, i.e. to determine the candidate 912 that is indicated by the obtained candidate data.

Figure 10:
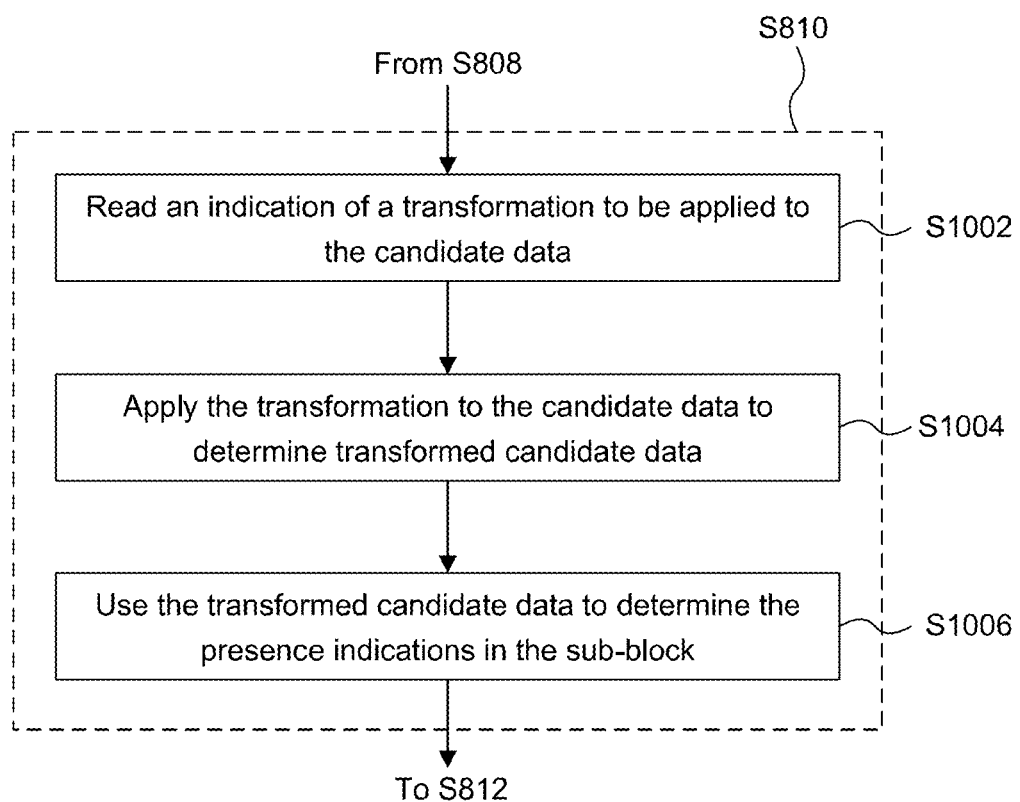
FIG. 10 illustrates an example of steps that can be performed to determine one or more of the presence indications in a sub-block using obtained candidate data for the sub-block.

For example, FIG. 10 shows some steps that may be performed in step S810 in order to determine the presence indications in the sub-block. As described above, the transformation may comprise one or both of a rotation and a reflection. The transform logic 908 is configured to receive the candidate data that was obtained in step S808 by the candidate data logic 906. The transform logic 908 is also configured to receive an indication of the region (e.g. quadrant) of the sub-block. As described above in relation to the candidate data logic 906, the transform logic 908 may receive the full sub-block indication 902 or just the MSBs of the x and y coordinates of the sub-block from the sub-block indication 902. In step S1002 the transform logic 908 reads, from the block of compressed data, one of the indications 506 of a transformation to be applied to the obtained candidate data. In particular, the transform logic 908 reads the transformation indication for the region that the sub-block is in.

In step S1004 the transform logic 908 applies the transformation to the obtained candidate data to determine transformed candidate data. As described above, the transformation may comprise one or both of a rotation and a reflection. It is noted that for at least one of the regions, a transformation may not be indicated in the block of compressed data. Furthermore, for a region which does have a transformation indication stored in the block of compressed data the transformation indication might indicate that the identity transform is to be applied to the candidate data. So the transform logic 908 does not necessarily alter the candidate data that it received from the candidate data logic 906. The transformed candidate data is passed from the transform logic 908 to the decode logic 910. It is noted that the "transformed candidate data" that is output from the transform logic 908 might not actually be the result of applying any transformations on candidate data (i.e. it may be equivalent to applying an identity transformation on candidate data). The "transformed candidate data" may be referred to as "output candidate data" from the transform logic 908.

In step S1006 the decode logic 910 uses the transformed candidate data to determine the one or more of the presence indications in the sub-block. In an example described above, the candidate data has 5 bits for a candidate, and the decode logic 910 determines the 8 bits (i.e. 2 bits for each of the presence indications in the sub-block) that explicitly represent each of the individual presence indications in the sub-block. In particular, as described in the example above, the data for a candidate has five bits:

A first bit to indicate one of: (i) a first palette of fully present and partially present, and (ii) a second palette of fully absent and partially present; and Four further bits including one bit for each of the four presence indications of the candidate to indicate either partially present or the other state of the indicated palette.

So the decode logic 910 uses the first bit to determine whether the first palette or the second palette is being used. Then, for each of the four presence indications of the candidate 912, the decode logic 910 uses a respective one of the further bits to determine whether the presence indication is partially present or the other state of the indicated palette.

In step S812 the decompression unit 318 outputs the determined presence indication(s). The determined sub-primitive presence indication(s) can be used to determine the presence of a primitive at a point of intersection with a ray as part of performing intersection testing for the ray in the ray tracing system.

As mentioned above, the use of the fixed-length compression scheme described herein means that the decompression process is simple to implement and can decompress some presence indications from a block of compressed data without decompressing the whole block (i.e. random access is possible from the block of compressed data). The compression unit 316 and the decompression unit 318 may be implemented in software or hardware or a combination thereof, and when the compression and/or decompression units are implemented in hardware (e.g. in fixed function circuitry) the simplicity of the compression and/or decompression processes means that the physical size of the hardware for these units is small. Furthermore, whether the compression and/or decompression units are implemented in hardware or software the simplicity of the compression and/or decompression processes means that the latency and power consumption of these units is low.

In the examples described above, a 16×16 block of presence indications is compressed using 64 2×2 sub-blocks, and a 50% compression rate of the presence indications is achieved such that the block of compressed data has 256 bits. One way to achieve higher compression (i.e. a lower compression ratio), at the risk of increasing the number of sub-primitives that are sub-optimally encoded as partially present, is to use larger sub-blocks. One example, with square vectors and a square map, may be to represent a block of 3N*3N (e.g. 48×48) presence indications as $N^2$ 3×3 sub-blocks, or to use non-square rectangular sub-blocks, e.g. 4×2 sub-blocks to represent a block of 4N*4N (or even a non-square 4N*2M) presence indications. It may be appreciated that using higher resolutions of sub-primitives will often result in a lower fraction of the more costly, partially present sub-primitives.

Figure 11:
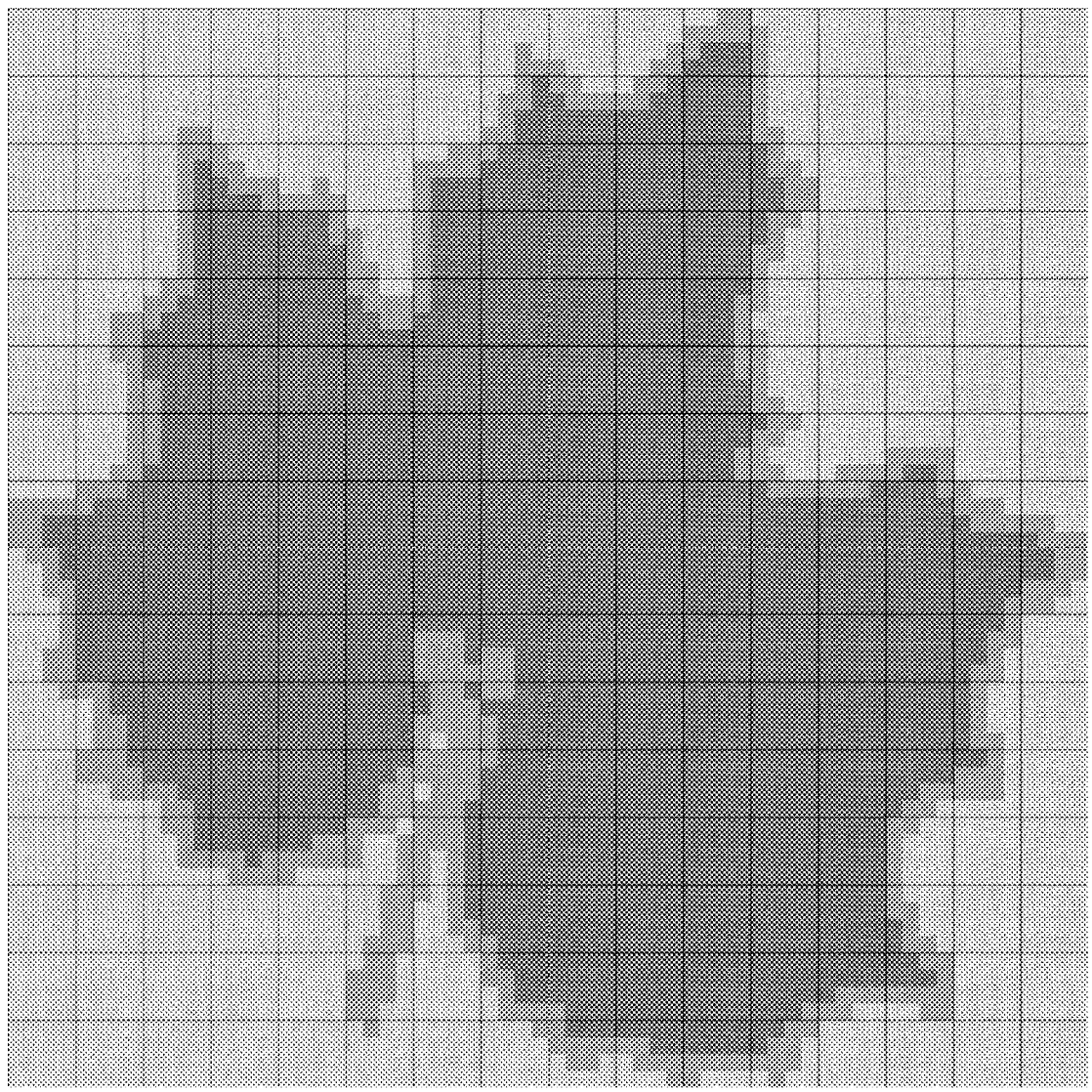
FIG. 11 shows a block of presence indications for a third object which has partial presence, the block of presence indications comprising 256 4×4 sub-blocks of presence indications.

However, we now go on to describe a more 'aggressive' approach (i.e. an approach that achieves greater compression) using 4×4 sub-blocks to compress a higher resolution block of presence indications with the aim of achieving an average of 0.5 bits of compressed data per presence indication (which corresponds to a compression ratio of 25%). In this example, the uncompressed block of presence indications is shown in FIG. 11 and is a 64×64 block of presence indications (i.e. there are 4096 presence indications in the block) which is divided into 256 4×4 sub-blocks of presence indications. In another example, not shown in the figures, the uncompressed block of presence indications is a 96×96 block of presence indications (i.e. there are 9216 presence indications in the block) which is divided into 576 4×4 sub-blocks of presence indications. In these examples, each sub-block has sixteen presence indications. In these examples, the indices that are stored in the block of compressed data may each have five bits, i.e. T=5.

Figure 12:
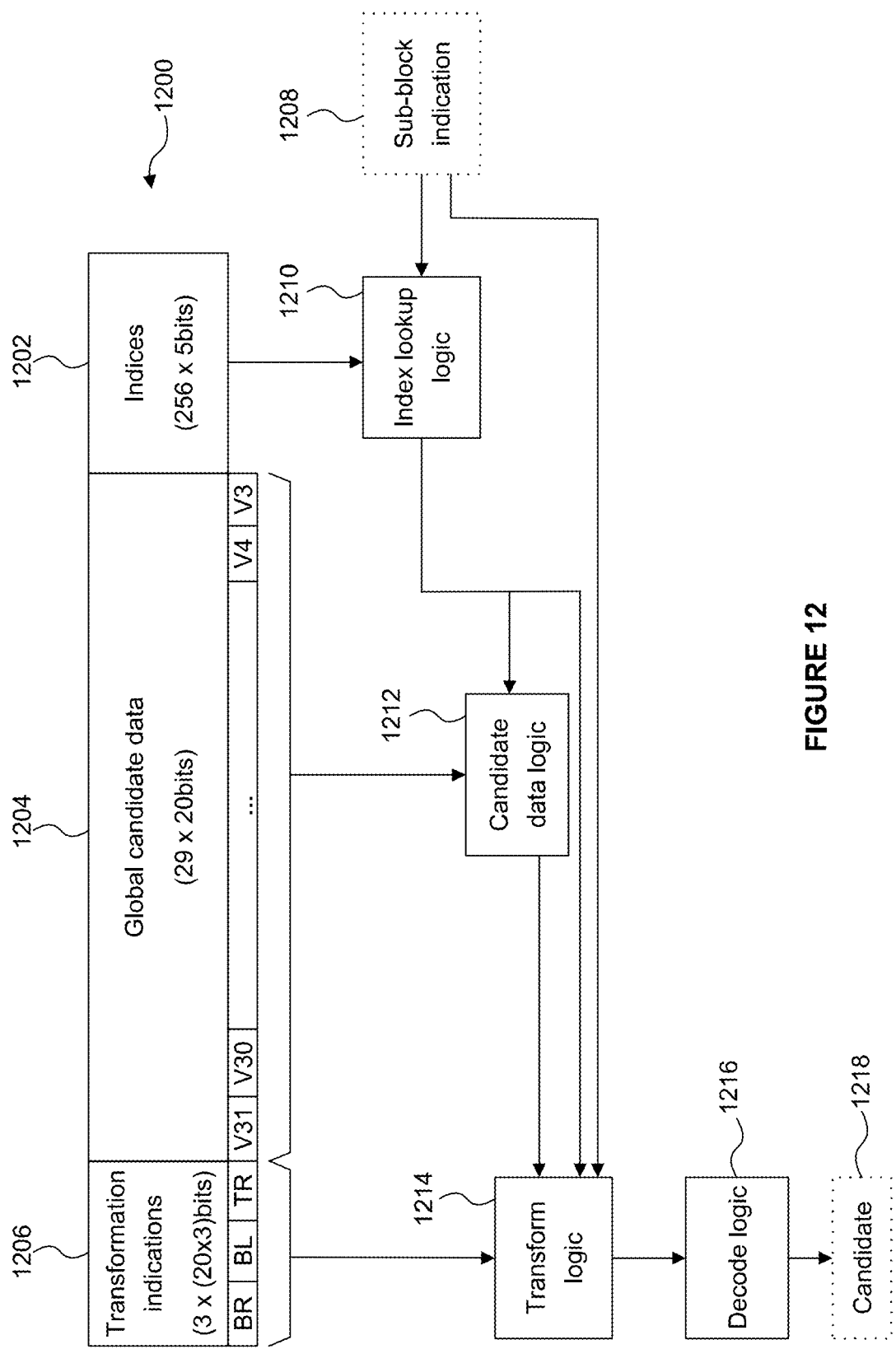
FIG. 12 shows an example of logic within a decompression unit for decompressing compressed data to determine one or more sub-primitive presence indications for the third object.

FIG. 12 shows an example of a block of compressed data 1200 in the example of compressing the 4096 presence indications shown in FIG. 11. The block of compressed data comprises indices 1202, candidate data 1204 and transformation indications 1206. With T=5, an index can indicate one out of a possible 32 candidates for a sub-block. In this example, there are 256 sub-blocks, and a 5-bit index is stored in the block of compressed data 1200 for each of the sub-blocks so the indices 1202 occupy 1280 bits. Similarly to those described in the examples described above, the three common candidates (i.e. fully present, fully absent and fully partially present) are so common that candidate data for these candidates does not need to be explicitly stored in the block of compressed data. In this example, there are only global candidates, i.e. there are no region-specific candidates. So candidate data for 29 global candidates is stored in the candidate data 1204 in the block of compressed data 1200.

In this example, each of the sub-blocks has sixteen presence indications in a 4×4 arrangement, and the candidate data in the block of compressed data for a candidate has, for each of four 2×2 groups of presence indications, five bits of candidate data comprising:
one bit to indicate one of: (i) a first palette of fully present and partially present, and (ii) a second palette of fully absent and partially present; and
one bit for each of the four presence indications of the 2×2 group to indicate either partially present or the other state of the indicated palette.

In this way, the 4×4 sub-block is encoded as four 2×2 groups which are each encoded in the same manner as for the 2×2 sub-blocks in the example described above with reference to FIG. 9.

The compression of a 64×64 block of presence indications as shown in FIG. 11 may be given a compression budget of 0.5 bits per presence indication, i.e. 2048 bits for the block of compressed data 1200. As described above, the 256 indices use 1280 bits. The candidate data for the 29 global candidates uses 580 bits (i.e. 29×20=580). The transformation indications 1206 can use up to 188 bits in order to satisfy the budget. So an enhanced quadrant transformation scheme can be used. Rather than have a single transformation for each quadrant, a set of transformations can be stored and indicated by the transformation indications for three of the quadrants (e.g. for each of the top right, bottom left and bottom right quadrants). For example, for each of three of the quadrants, for each of the first 19 of the 29 entries in the codebook, a unique 3-bit transformation indication may be stored, whilst the remaining 10 entries may share one transformation indication. Therefore, 60 bits are used for the transformation indications for each of three of the quadrants, so 180 bits are used for the transformation indications in total, as shown in FIG. 12. Alternatively, transformations may be assigned to adjacent pairs of entries in the codebook.

The decompression unit 318 will operate in a similar manner in this example as described above with reference to FIG. 9. In particular, the decompression unit includes index lookup logic 1210, candidate data logic 1212, transform logic 1214 and decode logic 1216. The decompression unit receives the block of compressed data 1200 and the sub-block indication 1208. The index lookup logic 1210 uses the sub-block indication 1208 to read an index from the indices 1202 for the sub-block indicated by the sub-block indication 1208. The index is used by the candidate data logic 1212 to obtain candidate data, either from the candidate data 1204 in the block of compressed data 1200 or just by obtaining the candidate data for one of the common candidates which is not explicitly stored in the block of compressed data 1200. In this example, since there are no region-specific candidates, the candidate data logic 1212 does not need to receive an indication of the region that the sub-block is in.

As mentioned above, each of the sub-blocks in this example has sixteen presence indications comprising four 2×2 groups of presence indications, and the obtained candidate data represents a candidate with, for each of four 2×2 groups of presence indications for a sub-block, five bits of candidate data comprising:
one bit to indicate one of: (i) a first palette of fully present and partially present, and (ii) a second palette of fully absent and partially present; and
one bit for each of the four presence indications of the 2×2 group to indicate either partially present or the other state of the indicated palette.

The transform logic 1214 receives the obtained candidate data from the candidate data logic 1212, the index from the index lookup logic 1210, and an indication of the quadrant that the sub-block is in from the sub-block indication. The transform logic 1214 uses the index and the indication of the quadrant that the sub-block is in to read the appropriate transformation indication from the block of compressed data. As described above, the transformation may for example be a rotation and/or a reflection. The transform logic 1214 then applies the transformation to the candidate data and outputs the transformed candidate data to the decode logic 1216.

The decode logic 1216 uses the transformed candidate data to determine the presence indications in the sub-block. In this example, the candidate data has 20 bits for a candidate, and the decode logic 1216 determines the 32 bits (i.e. 2 bits for each of the sixteen presence indications in the sub-block) that explicitly represent each of the individual presence indications in the sub-block. These presence indications are output from the decode logic 1216 as the candidate 1218.

Figure 13:
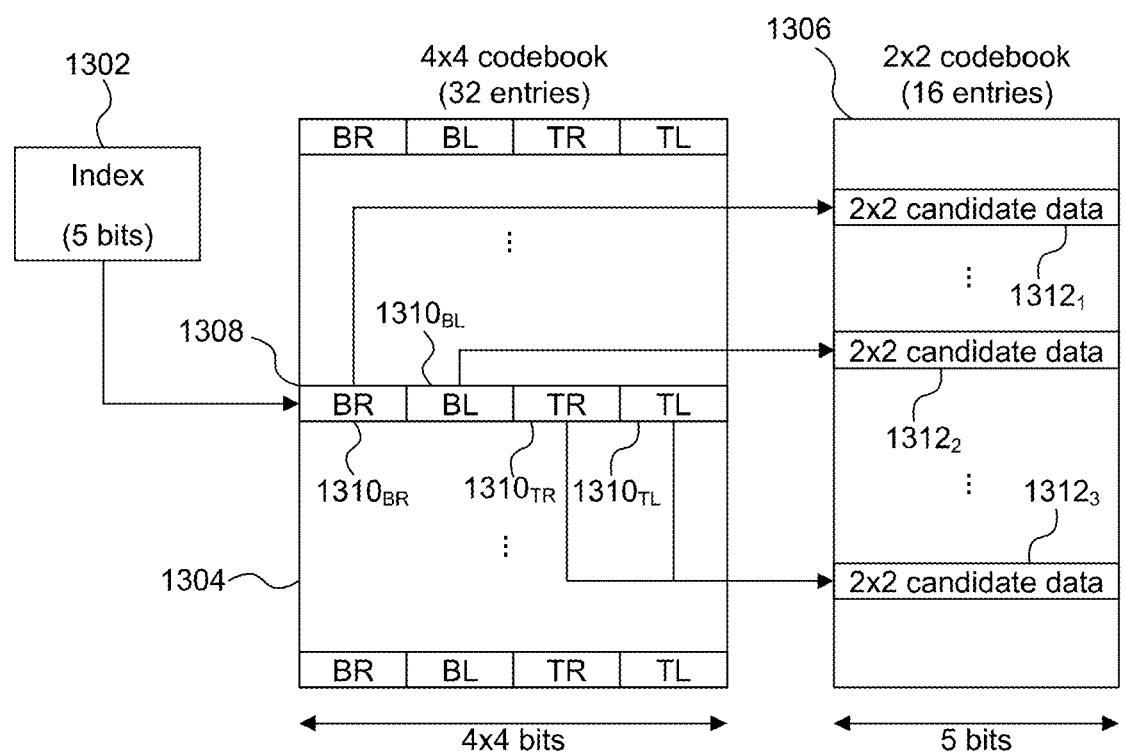
FIG. 13 shows how candidate data may be formatted and obtained in another example within a decompression unit for decompressing compressed data to determine one or more sub-primitive presence indications for the third object.

FIG. 13 illustrates another scheme in which a two stage encoding technique is used for the candidate data for candidates for 4×4 sub-blocks of presence indications. In this example, a 5-bit index 1302 is used to indicate an entry in a first ("4×4") codebook 1304. Each entry in the first codebook 1304 includes four references to a second ("2×2") codebook 1306. The second codebook 1306 may be referred to as a "sub-codebook". For example, the index 1302 indicates an entry 1308 in the first codebook 1304 which includes four references (or "sub-indices"): (i) a reference $1310_{BR}$ which indicates a first entry $1312_1$ in the second codebook 1306 for use in representing a bottom right 2×2 group of presence indications in the 4×4 sub-block, (ii) a reference $1310_{BL}$ which indicates a second entry $1312_2$ in the second codebook 1306 for use in representing a bottom left 2×2 group of presence indications in the 4×4 sub-block, (iii) a reference $1310_{TR}$ which indicates a third entry $1312_3$ in the second codebook 1306 for use in representing a top right 2×2 group of presence indications in the 4×4 sub-block, and (iv) a reference $1310_{TL}$ which also indicates the third entry $1312_3$ in the second codebook 1306 for use in representing a top left 2×2 group of presence indications in the 4×4 sub-block.

To reiterate, in the example shown in FIG. 13, each of the sub-blocks has sixteen presence indications comprising four 2×2 groups of presence indications, and each of the candidates which is represented by candidate data in the block of compressed data is represented with:
for each of four 2×2 groups of presence indications for a sub-block, a sub-index to indicate an entry in a sub-codebook; and
the sub-codebook comprising a plurality of entries for 2×2 groups of presence indications, wherein each entry in the sub-codebook comprises five bits of candidate data comprising:

one bit to indicate one of: (i) a first palette of fully present and partially present, and (ii) a second palette of fully absent and partially present; and one bit for each of the four presence indications of the 2×2 group to indicate either partially present or the other state of the indicated palette.

In the decompression unit, when the candidate data has been obtained for a candidate form the first and second codebooks 1304 and 1306, the candidate data can be processed as described above with reference to FIG. 12 in order to determine a 4×4 candidate of presence indications.

Given that, in some examples, the value of only one region is needed, the second codebook 1306 does not need to be multi-ported. The quadrant transformations can be used to partially apply these to the outputs of the first codebook 1304 to select just one of the 2×2 indices and, in turn, use that to access the second codebook 1306. The output of the second codebook 1306 will, in turn, be transformed/selected as described in the examples above.

There are 32 entries in the first codebook 1304, and each entry has four references, each of which has four bits. So the first codebook 1304 has 512 bits. There are 16 entries in the second codebook 1306, each of which has five bits. So the second codebook 1306 has 80 bits. So the total number of bits used to represent the first and second codebooks is 582 bits. It is noted that this is very similar to the number of bits (580) of candidate data 1204 used in the example shown in FIG. 12, but the two-level scheme shown in FIG. 13 provides more flexibility in the number of different candidates that can be represented (at the cost of increasing the complexity of compression and decompression).

In the examples described herein the sub-primitives are squares, but in other examples they could be other shapes, e.g. triangles.

It is to be understood that the specific numbers in the examples described herein (e.g. the number of presence indications in a block and in a sub-block, and the number of bits used to represent the indices, the candidate data and the transformation indications) are given by way of example, and in other implementations these numbers could be different.

Further, the examples provided herein use triangles and barycentric coordinates, but the schemes presented herein are also applicable to a surface that can be represented parametrically, e.g. tensor product patches such as bicubic patches, a sphere, or a (portion of) a surface of revolution or extrusion. The parameters can be used to index into the presence indications.

The main examples described herein have used the presence indications for the acceleration of ray tracing, but the method is also applicable to other rendering techniques, e.g. rasterisation. As mentioned in the background section above, GB patents 2538856 and 2522868 describe the use of an opacity state map to accelerate the processing of punch through primitives in a rasterisation system. In particular, the opacity state map is used to indicate whether blocks of texels of a texture are fully opaque, fully transparent, partially transparent or a mixture of these states. The indications in the opacity state map can be used to accelerate the processing of punch through polygons in a rasterization system. Similar to the presence indications described above with reference to a ray tracing system, each of the opacity states in the rasterization system of GB2538856B and GB2522868B is represented with two bits. The methods of compression/decompression of the presence indications described herein can also be applied to compress/decompress the indications of the opacity states in a rasterization system such as that described in GB2538856B and GB2522868B. The 'partially transparent' state and the 'mixture' state can be combined into a single state so that there are just three states, which can then be compressed/decompressed in the same way as for the fully present, partially present and fully absent presence states in the ray tracing systems described above.

Figure 14:
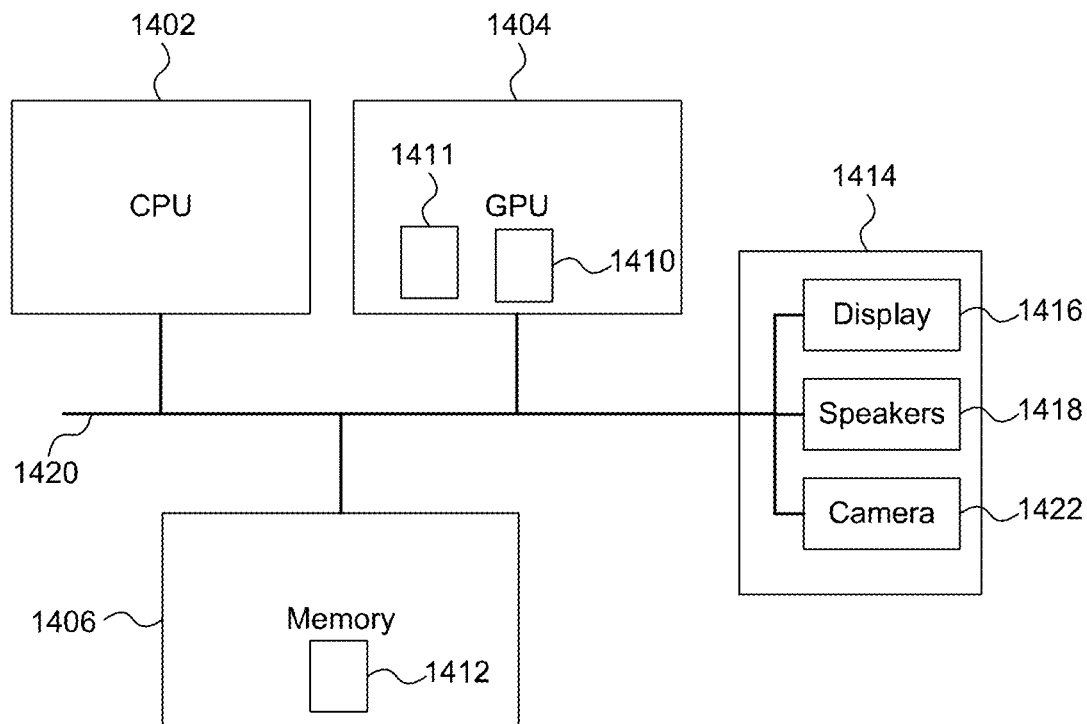
FIG. 14 shows a computer system in which a compression unit and/or a decompression unit is implemented.

FIG. 14 shows a computer system in which the compression and decompression units described herein may be implemented. The computer system comprises a CPU 1402, a GPU 1404, a memory 1406 and other devices 1414, such as a display 1416, speakers 1418 and a camera 1422. A processing block 1410 (corresponding to the ray tracing unit 302) is implemented on the GPU 1404, as well as a Neural Network Accelerator (NNA) 1411. In other examples, the processing block 1410 may be implemented on the CPU 1402 or within the NNA 1411. The components of the computer system can communicate with each other via a communications bus 1420. A store 1412 (corresponding to memory 304) is implemented as part of the memory 1406.

While FIG. 14 illustrates one implementation of a graphics processing system, it will be understood that a similar block diagram could be drawn for an artificial intelligence accelerator system—for example, by replacing either the CPU 1402 or the GPU 1404 with a Neural Network Accelerator (NNA) 1411, or by adding the NNA as a separate unit. In such cases, again, the processing block 1410 can be implemented in the NNA.

The ray tracing unit of FIG. 3a is shown as comprising a number of functional blocks. This is schematic only and is not intended to define a strict division between different logic elements of such entities. Each functional block may be provided in any suitable manner. It is to be understood that intermediate values described herein as being formed by a compression and/or decompression unit need not be physically generated by the compression and/or decompression unit at any point and may merely represent logical values which conveniently describe the processing performed by the compression and/or decompression unit between its input and output.

The compression and/or decompression units described herein may be embodied in hardware on an integrated circuit. The compression and/or decompression units described herein may be configured to perform any of the methods described herein. Generally, any of the functions, methods, techniques or components described above can be implemented in software, firmware, hardware (e.g., fixed logic circuitry), or any combination thereof. The terms "module," "functionality," "component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, bytecode, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be or comprise any kind of general purpose or dedicated processor, such as a CPU, GPU, NNA, System-on-chip, state machine, media processor, an application-specific integrated circuit (ASIC), a programmable logic array, a field-programmable gate array (FPGA), or the like. A computer or computer system may comprise one or more processors.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed (i.e. run) in an integrated circuit manufacturing system configures the system to manufacture a compression and/or decompression unit configured to perform any of the methods described herein, or to manufacture a compression and/or decompression unit comprising any apparatus described herein. An integrated circuit definition dataset may be, for example, an integrated circuit description.

Therefore, there may be provided a method of manufacturing, at an integrated circuit manufacturing system, a compression and/or decompression unit as described herein. Furthermore, there may be provided an integrated circuit definition dataset that, when processed in an integrated circuit manufacturing system, causes the method of manufacturing a compression and/or decompression unit to be performed.

An integrated circuit definition dataset may be in the form of computer code, for example as a netlist, code for configuring a programmable chip, as a hardware description language defining hardware suitable for manufacture in an integrated circuit at any level, including as register transfer level (RTL) code, as high-level circuit representations such as Verilog or VHDL, and as low-level circuit representations such as OASIS® and GDSII. Higher level representations which logically define hardware suitable for manufacture in an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture a compression and/or decompression unit will now be described with respect to FIG. 15.

Figure 15:
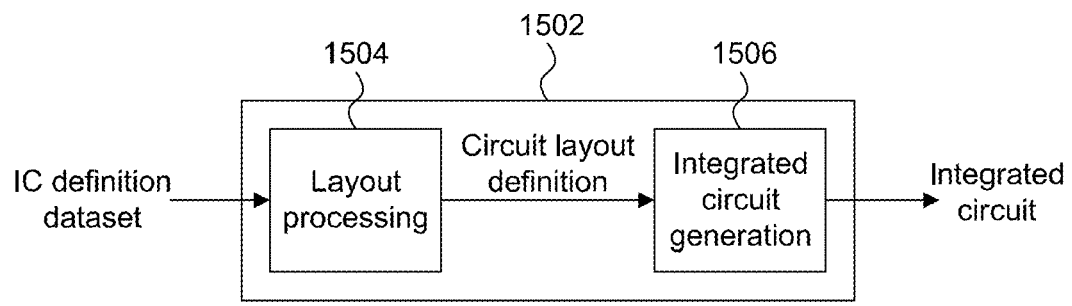
FIG. 15 shows an integrated circuit manufacturing system for generating an integrated circuit embodying a compression unit or a decompression unit.

FIG. 15 shows an example of an integrated circuit (IC) manufacturing system 1502 which is configured to manufacture a compression and/or decompression unit as described in any of the examples herein. In particular, the IC manufacturing system 1502 comprises a layout processing system 1504 and an integrated circuit generation system 1506. The IC manufacturing system 1502 is configured to receive an IC definition dataset (e.g. defining a compression and/or decompression unit as described in any of the examples herein), process the IC definition dataset, and generate an IC according to the IC definition dataset (e.g. which embodies a compression and/or decompression unit as described in any of the examples herein). The processing of the IC definition dataset configures the IC manufacturing system 1502 to manufacture an integrated circuit embodying a compression and/or decompression unit as described in any of the examples herein.

The layout processing system 1504 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 1504 has determined the circuit layout it may output a circuit layout definition to the IC generation system 1506. A circuit layout definition may be, for example, a circuit layout description.

The IC generation system 1506 generates an IC according to the circuit layout definition, as is known in the art. For example, the IC generation system 1506 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 1506 may be in the form of computer-readable code which the IC generation system 1506 can use to form a suitable mask for use in generating an IC.

The different processes performed by the IC manufacturing system 1502 may be implemented all in one location, e.g. by one party. Alternatively, the IC manufacturing system 1502 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture a compression and/or decompression unit without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 15 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 15, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

The implementation of concepts set forth in this application in devices, apparatus, modules, and/or systems (as well as in methods implemented herein) may give rise to performance improvements when compared with known implementations. The performance improvements may include one or more of increased computational performance, reduced latency, increased throughput, and/or reduced power consumption. During manufacture of such devices, apparatus, modules, and systems (e.g. in integrated circuits) performance improvements can be traded-off against the physical implementation, thereby improving the method of manufacture. For example, a performance improvement may be traded against layout area, thereby matching the performance of a known implementation but using less silicon. This may be done, for example, by reusing functional blocks in a serialised fashion or sharing functional blocks between elements of the devices, apparatus, modules and/or systems. Conversely, concepts set forth in this application that give rise to improvements in the physical implementation of the devices, apparatus, modules, and systems (such as reduced silicon area) may be traded for improved performance. This may be done, for example, by manufacturing multiple instances of a module within a predefined area budget.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

What is claimed is:

1. A method of compressing, into a block of compressed data, a block of sub-primitive presence indications for use in a rendering system, wherein the block of sub-primitive presence indications comprises a plurality of sub-blocks of sub-primitive presence indications, the method comprising:
   identifying a plurality of candidates for combinations of presence indications; and
   for each of the sub-blocks in the block of sub-primitive presence indications:
      selecting one of the candidates to be used to represent the sub-block, and
      storing, in the block of compressed data, an index to indicate the selected candidate.

2. The method of claim 1, further comprising storing, in the block of compressed data, candidate data representing one or more of the plurality of candidates.

3. The method of claim 2, wherein the candidate data representing one or more of the plurality of candidates is stored in a respective one or more entries in a codebook in the block of compressed data.

4. The method of claim 2, wherein each of the sub-blocks has four presence indications in a 2×2 arrangement, and wherein each of the one or more of the plurality of candidates which is represented by candidate data in the block of compressed data is represented with five bits of candidate data comprising:
   one bit to indicate one of: (i) a first palette of fully present and partially present, and (ii) a second palette of fully absent and partially present; and
   one bit for each of the four presence indications of the candidate to indicate either partially present or the other state of the indicated palette.

5. The method of claim 2, wherein each of the sub-blocks has sixteen presence indications comprising four 2×2 groups of presence indications, and wherein each of the one or more of the plurality of candidates which is represented by candidate data in the block of compressed data is represented with, for each of four 2×2 groups of presence indications for a sub-block, five bits of candidate data comprising:
   one bit to indicate one of: (i) a first palette of fully present and partially present, and (ii) a second palette of fully absent and partially present; and
   one bit for each of the four presence indications of the 2×2 group to indicate either partially present or the other state of the indicated palette.

6. The method of claim 2, wherein each of the sub-blocks has sixteen presence indications comprising four 2×2 groups of presence indications, and wherein each of the one or more of the plurality of candidates which is represented by candidate data in the block of compressed data is represented with:
   for each of four 2×2 groups of presence indications for a sub-block, a sub-index to indicate an entry in a sub-codebook; and
   the sub-codebook comprising a plurality of entries for 2×2 groups of presence indications, wherein each entry in the sub-codebook comprises five bits of candidate data comprising:
      one bit to indicate one of: (i) a first palette of fully present and partially present, and (ii) a second palette of fully absent and partially present; and
      one bit for each of the four presence indications of the 2×2 group to indicate either partially present or the other state of the indicated palette.

7. The method of claim 1, wherein at least one of the plurality of candidates is not represented by candidate data stored in the block of compressed data.

8. The method of claim 7, wherein each of said at least one of the plurality of candidates that is not represented by candidate data stored in the block of compressed data represents a sub-block whose sub-primitive presence indications are all the same.

9. The method of claim 1, wherein the sub-primitive presence indications indicate a presence state for their respective sub-primitives as one of: (i) fully present, (ii) fully absent, or (iii) partially present.

10. The method of claim 1, wherein the index for a sub-block is a T-bit index, wherein T is less than the number of sub-primitive presence indications in one of the sub-blocks.

11. The method of claim 1, wherein the block of sub-primitive presence indications has a plurality of regions, each of the regions comprising a plurality of the sub-blocks, wherein one or more of the identified candidates are region-specific candidates such that they are candidates for sub-blocks within only one of the regions of the block.

12. The method of claim 11, wherein one or more of the identified candidates are global candidates such that they are candidates for sub-blocks within all of the regions of the block.

13. The method of claim 12, wherein candidate data stored in the block of compressed data has: (i) candidate data representing three global candidates, and (ii) candidate data representing two region-specific candidates for each of the regions.

14. The method of claim 11, further comprising storing, in the block of compressed data, for each of one or more of the regions, an indication of a transformation to be applied to candidate data representing candidates for sub-blocks within that region.

15. The method of claim 14, wherein the transformation comprises one or both of a rotation and a reflection.

16. The method of claim 14, wherein each of the indications of a transformation comprises three 1-bit flags: (i) a 90 degree rotation flag, (ii) a vertical reflection flag, and (iii) a horizontal reflection flag.

17. The method of claim 1, wherein said selecting one of the candidates to be used to represent the sub-block comprises selecting a candidate which is compatible with the presence indications in the sub-block.

18. The method of claim 1, wherein the rendering system is a ray tracing system or a rasterization system.

19. A compression unit configured to compress, into a block of compressed data, a block of sub-primitive presence indications for use in a rendering system, wherein the block of sub-primitive presence indications comprises a plurality of sub-blocks of sub-primitive presence indications, the compression unit being configured to:
identify a plurality of candidates for combinations of presence indications; and
for each of the sub-blocks in the block of sub-primitive presence indications:
select one of the candidates to be used to represent the sub-block, and
store, in the block of compressed data, an index to indicate the selected candidate.

20. A non-transitory computer readable storage medium having stored thereon an integrated circuit definition dataset that, when processed in an integrated circuit manufacturing system, configures the integrated circuit manufacturing system to manufacture a compression unit configured to compress, into a block of compressed data, a block of sub-primitive presence indications for use in a rendering system, wherein the block of sub-primitive presence indications comprises a plurality of sub-blocks of sub-primitive presence indications, the compression unit being configured to:
identify a plurality of candidates for combinations of presence indications; and
for each of the sub-blocks in the block of sub-primitive presence indications:
select one of the candidates to be used to represent the sub-block, and
store, in the block of compressed data, an index to indicate the selected candidate.

* * * * *